United States Patent
Lu

(10) Patent No.: US 12,406,621 B2
(45) Date of Patent: Sep. 2, 2025

(54) DISPLAY PANEL AND DRIVING METHOD THEREOF, AND DISPLAY DEVICE

(71) Applicant: Wuhan Tianma Microelectronics Co., Ltd., Wuhan (CN)

(72) Inventor: Xing Lu, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/234,570

(22) Filed: Aug. 16, 2023

(65) Prior Publication Data

US 2023/0395027 A1    Dec. 7, 2023

(30) Foreign Application Priority Data

Mar. 29, 2023   (CN) .......................... 202310344070.8

(51) Int. Cl.
G09G 3/3233    (2016.01)
G09G 3/3266    (2016.01)
H10K 59/121    (2023.01)
H10K 59/131    (2023.01)

(52) U.S. Cl.
CPC ......... *G09G 3/3233* (2013.01); *G09G 3/3266* (2013.01); *H10K 59/1216* (2023.02); *H10K 59/131* (2023.02); *G09G 2300/0426* (2013.01); *G09G 2300/0452* (2013.01); *G09G 2300/0842* (2013.01); *G09G 2300/0861* (2013.01); *G09G 2310/0286* (2013.01); *G09G 2310/08* (2013.01); *G09G 2320/0242* (2013.01)

(58) Field of Classification Search
CPC ......... G09G 3/3233; G09G 2300/0426; G09G 2300/0452; G09G 2300/0842; G09G 2300/0861; H10K 59/131; H10K 59/1216
See application file for complete search history.

(56) References Cited

U.S. PATENT DOCUMENTS

| 12,087,226 | B1* | 9/2024 | Zhang | G09G 3/3233 |
| 2006/0208973 | A1* | 9/2006 | Lee | G09G 3/3233 |
| | | | | 345/76 |
| 2009/0009540 | A1* | 1/2009 | Liu | G09G 3/325 |
| | | | | 345/690 |
| 2012/0242712 | A1* | 9/2012 | Ko | G09G 3/3233 |
| | | | | 345/212 |
| 2016/0140897 | A1* | 5/2016 | Park | G09G 3/3233 |
| | | | | 345/77 |
| 2019/0081240 | A1* | 3/2019 | Wei | H10K 59/122 |
| 2019/0220143 | A1* | 7/2019 | Kim | G06F 3/0446 |
| 2020/0402458 | A1* | 12/2020 | Gao | G09G 3/3233 |

(Continued)

FOREIGN PATENT DOCUMENTS

CN    106652903 A    5/2017
CN    113314583 A    8/2021

*Primary Examiner* — Ariel A Balaoing
(74) *Attorney, Agent, or Firm* — KDW Firm PLLC

(57) ABSTRACT

Provided are a display panel and a driving method thereof, and a display device. A light emission control transistor of a pixel driving circuit in the display panel is connected in series between the anode of a light-emitting element and a first power signal line. A cathode switch transistor is connected in series between the cathode of the light-emitting element and a second power signal line. In at least one light emission stage, the time when the cathode switch transistor is turned on lags behind the time when the light emission control transistor is turned on.

20 Claims, 18 Drawing Sheets

(56) References Cited

U.S. PATENT DOCUMENTS

| | | | | |
|---|---|---|---|---|
| 2021/0098539 A1* | 4/2021 | Zhang | ............... | H10K 59/131 |
| 2021/0313402 A1* | 10/2021 | Zhou | ............... | H10K 59/353 |
| 2021/0359075 A1* | 11/2021 | Liu | ............... | H10K 59/80515 |
| 2022/0293696 A1* | 9/2022 | Xin | ............... | H10K 59/88 |
| 2022/0335896 A1* | 10/2022 | Kuang | ............... | G09G 3/3291 |

\* cited by examiner

DISPLAY PANEL AND DRIVING METHOD THEREOF, AND DISPLAY DEVICE

CROSS-REFERENCE TO RELATED APPLICATION

This application claims priority to Chinese Patent Application No. 202310344070.8 filed Mar. 29, 2023, the disclosure of which is incorporated herein by reference in its entirety.

TECHNICAL FIELD

The present disclosure relates to the field of display technologies and, in particular, to a display panel and a driving method thereof, and a display device.

BACKGROUND

An organic light-emitting diode (OLED) display panel has the advantages of high visibility, high brightness, and being thinner. Therefore, the OLED display panel is more and more widely used.

However, in an existing OLED display panel, there is a problem of display color cast. This affects the display effect of the display panel.

SUMMARY

The present disclosure provides a display panel and a driving method thereof, and a display device to improve the color cast problem.

According to one aspect of the present disclosure, a display panel is provided. The display panel includes a cathode switch transistor and a plurality of sub-pixels arranged in an array.

A sub-pixel of the plurality of sub-pixels includes a pixel driving circuit and a light-emitting element electrically connected to the pixel driving circuit. The pixel driving circuit includes a drive transistor and at least one light emission control transistor.

The drive transistor, the light emission control transistor, the at least one light-emitting element, and the cathode switch transistor are connected in series between a first power signal line and a second power signal line. The light emission control transistor is connected in series between the anode of the light-emitting element and the first power signal line. The cathode switch transistor is connected in series between the cathode of the light-emitting element and the second power signal line.

The gate of the light emission control transistor is electrically connected to a first light emission control signal line. The gate of the cathode switch transistor is electrically connected to a second light emission control signal line. In at least one light emission stage, the start time of an effective pulse of a second light emission control signal of the second light emission control signal line lags behind the start time of an effective pulse of a first light emission control signal of the first light emission control signal line.

According to another aspect of the present disclosure, a display device is provided. The display device includes the display panel described in the first aspect.

According to another aspect of the present disclosure, a driving method of a display panel is provided. The display panel includes a cathode switch transistor and a plurality of sub-pixels arranged in an array. A sub-pixel of the plurality of sub-pixels includes a pixel driving circuit and a light-emitting element electrically connected to the pixel driving circuit. The pixel driving circuit includes a drive transistor and at least one light emission control transistor. The drive transistor, the light emission control transistor, the at least one light-emitting element, and the cathode switch transistor are connected in series between a first power signal line and a second power signal line. The light emission control transistor is connected in series between the anode of the light-emitting element and the first power signal line. The cathode switch transistor is connected in series between the cathode of the light-emitting element and the second power signal line. The gate of the light emission control transistor is electrically connected to a first light emission control signal line. The gate of the cathode switch transistor is electrically connected to a second light emission control signal line.

The driving method includes that a first light emission control signal is applied to the first light emission control signal line and a second light emission control signal is applied to the second light emission control signal line, where in at least one light emission stage, the start time of an effective pulse of the second light emission control signal lags behind the start time of an effective pulse of the first light emission control signal.

According to the display panel and the driving method thereof, and the display device provided in the embodiments of the present disclosure, the light emission control transistor is connected in series between the anode of the light-emitting element and the first power signal line, the cathode switch transistor is connected in series between the cathode of the light-emitting element and the second power signal line, the gate of the light emission control transistor is electrically connected to the first light emission control signal line, the gate of the cathode switch transistor is electrically connected to the second light emission control signal line, and in the light emission stage, the start time of an effective pulse of a second light emission control signal of the second light emission control signal line lags behind the start time of an effective pulse of a first light emission control signal of the first light emission control signal line. Thus, in the light emission stage, the light emission control transistor is first turned on so that the pixel capacitor of the light-emitting element is charged, and after the charging of pixel capacitors of light-emitting elements emitting light of different colors is completed, the cathode switch transistor is turned on. Therefore, the light-emitting elements emitting light of different colors emit light simultaneously when the cathode switch transistor is turned on so that the light-emitting duration and luminescence efficiency of the light-emitting elements emitting light of different colors tend to be consistent in the light emission stage, thereby solving the color cast problem caused by the difference in the pixel capacitors of the light-emitting elements emitting light of different colors.

It is to be understood that the contents described in this part are not intended to identify key or important features of the embodiments of the present disclosure, and are not intended to limit the scope of the present disclosure. Other features of the present disclosure are readily understood through the description hereinafter.

BRIEF DESCRIPTION OF DRAWINGS

To illustrate technical solutions in embodiments of the present disclosure more clearly, drawings used in description of the embodiments are briefly described below. Apparently, the drawings described below merely illustrate part of the embodiments of the present disclosure. Those of ordinary skill in the art may obtain other drawings based on the drawings on the premise that no creative work is done.

DETAILED DESCRIPTION

The technical solutions in the embodiments of the present disclosure are described clearly and completely in conjunction with the drawings in the embodiments of the present disclosure from which the solutions of the present disclosure are better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that the terms "first", "second", and the like in the description, claims, and drawings of the present disclosure are used for distinguishing between similar objects and are not necessarily used for describing a particular order or sequence. It is to be understood that the data used in this way is interchangeable where appropriate so that the embodiments of the present disclosure described herein may also be implemented in a sequence not illustrated or described herein. In addition, the terms "including", "having", or any other variations thereof described herein are intended to encompass a non-exclusive inclusion. For example, a process, method, system, product, or device that includes a series of steps or units may include not only the expressly listed steps or units but also other steps or units that are not expressly listed or are inherent to such a process, method, system, product, or device.

Figure 1:
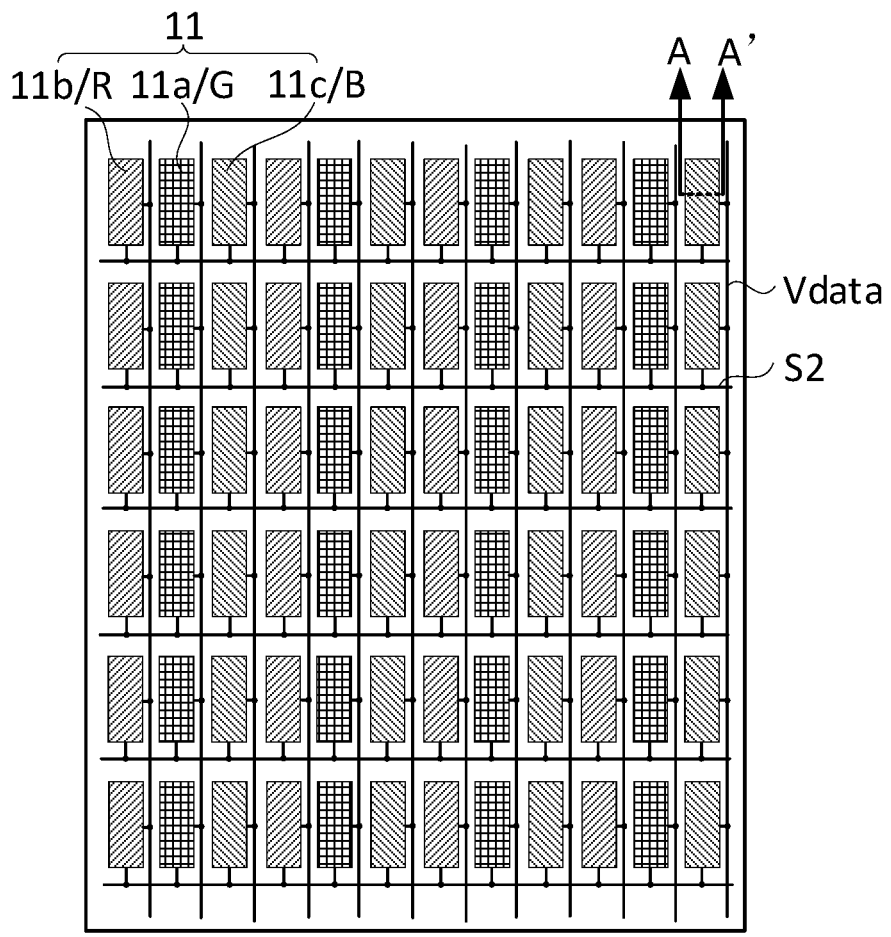
FIG. 1 is a diagram illustrating the structure of a display panel according to an embodiment of the present disclosure.
Figure 2:
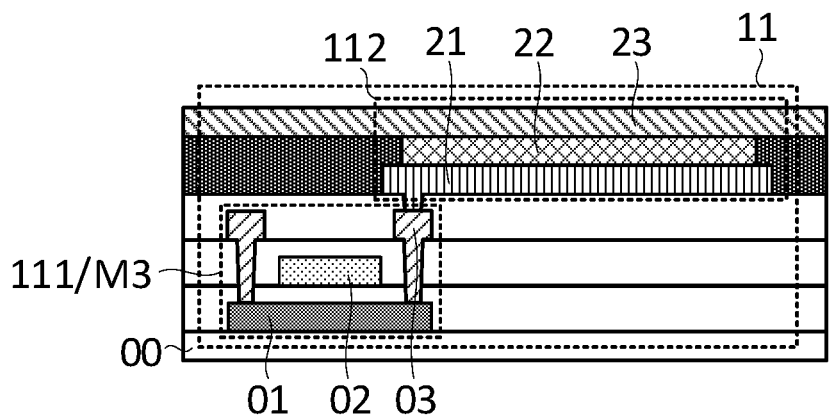
FIG. 2 is a sectional structure diagram of FIG. 1 taken along direction A-A'.
Figure 3:
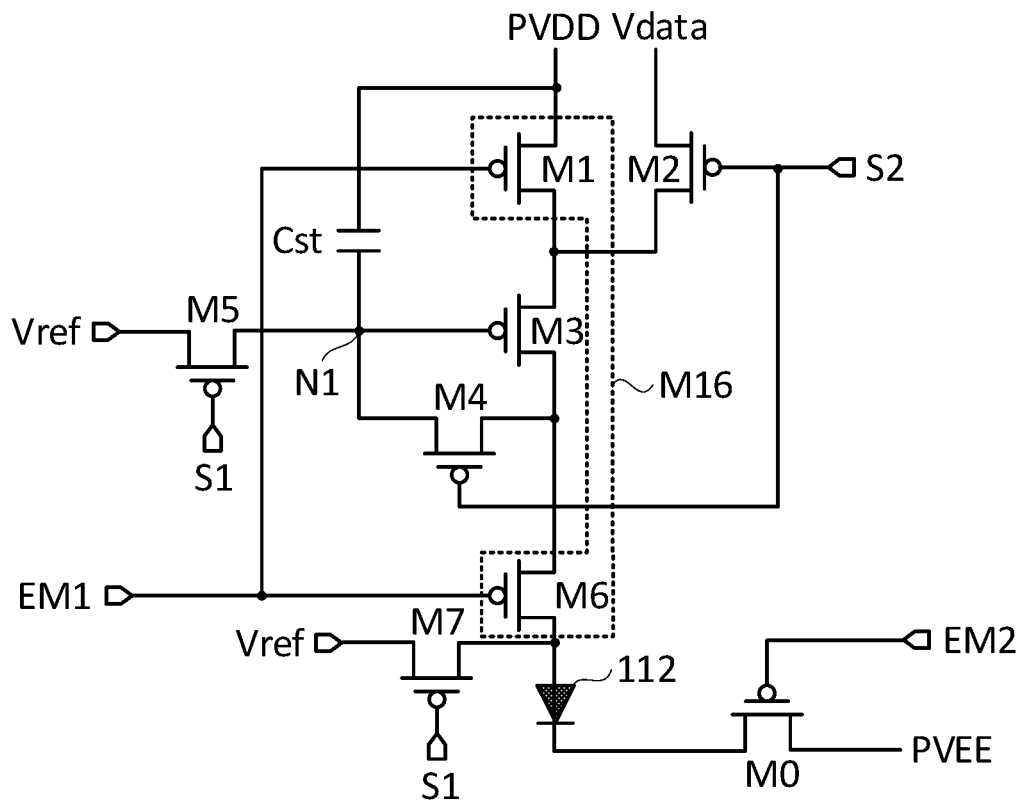
FIG. 3 is a diagram illustrating the structure of a pixel driving circuit according to an embodiment of the present disclosure.
Figure 4:
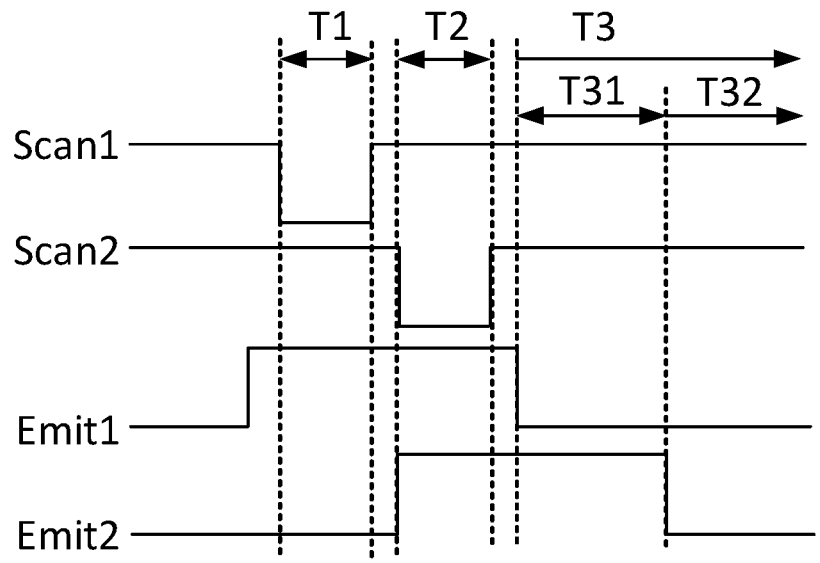
FIG. 4 is a drive timing diagram of a pixel driving circuit according to an embodiment of the present disclosure.

FIG. 1 is a diagram illustrating the structure of a display panel according to an embodiment of the present disclosure. FIG. 2 is a sectional structure diagram of FIG. 1 taken along direction A-A'. FIG. 3 is a diagram illustrating the structure of a pixel driving circuit according to an embodiment of the present disclosure. FIG. 4 is a drive timing diagram of a pixel driving circuit according to an embodiment of the present disclosure. As shown in FIGS. 1 to 4, a display panel provided in this embodiment of the present disclosure includes a cathode switch transistor M0 and multiple sub-pixels 11 arranged in an array. A sub-pixel 11 includes a pixel driving circuit 111 and a light-emitting element 112 electrically connected to the pixel driving circuit 111. The pixel driving circuit 111 includes a drive transistor M3 and at least one light emission control transistor M16. The drive transistor M3, the light emission control transistor M16, the light-emitting element 112, and the cathode switch transistor M0 are connected in series between a first power signal line PVDD and a second power signal line PVEE. The light emission control transistor M16 is connected in series between the anode of the light-emitting element 112 and the first power signal line PVDD. The cathode switch transistor M0 is connected in series between the cathode of the light-emitting element 112 and the second power signal line PVEE. The gate of the light emission control transistor M16 is electrically connected to a first light emission control signal line EM1. The gate of the cathode switch transistor M0 is electrically connected to a second light emission control signal line EM2. In at least one light emission stage, the start time of an effective pulse of a second light emission control signal of the second light emission control signal line EM2 lags behind the start time of an effective pulse of a first light emission control signal of the first light emission control signal line EM1.

Specifically, as shown in FIGS. 1 to 4, the display panel provided in this embodiment may be an organic light-emitting diode (OLED) display panel. Multiple sub-pixels 11 arranged in an array are disposed on the display panel. The multiple sub-pixels 11 may include at least two sub-pixels 11 of different colors. For example, as shown in FIG. 1, the multiple sub-pixels 11 may include a red sub-pixel R, a green sub-pixel G, and a blue sub-pixel B. In some other embodiments, a white sub-pixel is also included to implement color image display.

In FIG. 1, only a standard RGB arrangement in which multiple sub-pixels 11 are arranged on the display panel is illustrated. In other embodiments, the multiple sub-pixels 11 may be arranged in another arrangement. In addition, the shape of the light-emitting region of a sub-pixel 11 includes, but is not limited to, a rectangle shown in FIG. 1. In other embodiments, the shape of the light-emitting region of the sub-pixel 11 may also be designed according to actual requirements.

Further, the sub-pixel 11 includes the pixel driving circuit 111 and the light-emitting element 112. As shown in FIG. 2, taking the light-emitting element 112 being an organic light-emitting diode as an example for illustration, the light-emitting element 112 may include an anode 21, a light-emitting layer 22, and a cathode 23 which are stacked; and when electrons and holes are injected into the light-emitting layer 22 from the cathode 23 and the anode 21, respectively, excitons are formed in the light-emitting layer 22, and the light-emitting molecules are excited so that the light-emitting layer 22 emits visible light. Different materials of light-emitting layers 22 are provided to emit visible light of different colors.

With continued reference to FIG. 2 and FIG. 3, the pixel driving circuit 111 is electrically connected to the light-emitting element 112. The pixel driving circuit 111 is configured to transmit a light-emitting drive current to the light-emitting element 112 under the action of a signal of a drive signal line (for example, a scan signal line, a data signal line, or a power signal line) on the display panel, thereby providing a drive current for the light-emitting element 112 to drive the light-emitting element 112 to emit light.

Specifically, as shown in FIG. 2 and FIG. 3, in the pixel driving circuit 111, the light-emitting element 112, the drive transistor M3, and the light emission control transistor M16 are connected in series between the first power signal line PVDD and the second power signal line PVEE, and the light emission control transistor M16 is connected in series between the anode of the light-emitting element 112 and the first power signal line PVDD. The first power signal line PVDD is configured to transmit a first power voltage. The second power signal line PVEE is configured to transmit a second power voltage. The first power voltage is greater than the second power voltage.

The drive transistor M3 can be turned on according to the gate potential of the drive transistor M3. The drive current formed by the turn-on of the drive transistor M3 is used for driving the light-emitting element 112 to emit light. The drive transistor M3 is used as a driving tube. The gate potential of the drive transistor M3 determines the magnitude of the current of the turn-on of the drive transistor M3. Thus, the brightness of the light-emitting element 112 can be adjusted by controlling the gate voltage of the drive transistor M3 to implement grayscale control.

The light emission control transistor M16 is configured to control turn on or off between the drive transistor M3 and the first power signal terminal PVDD. The light emission control transistor M16 is used as a switch transistor. The light emission control transistor M16 implements turn on and off according to the gate voltage of the light emission control transistor M16. As shown in FIG. 3, the gate of the light emission control transistor M16 is electrically connected to the light emission control signal line EM1 so that the light emission control transistor M16 can be turned on or off under the control of the first light emission control signal transmitted by the light emission control signal line EM1.

Figure 5:
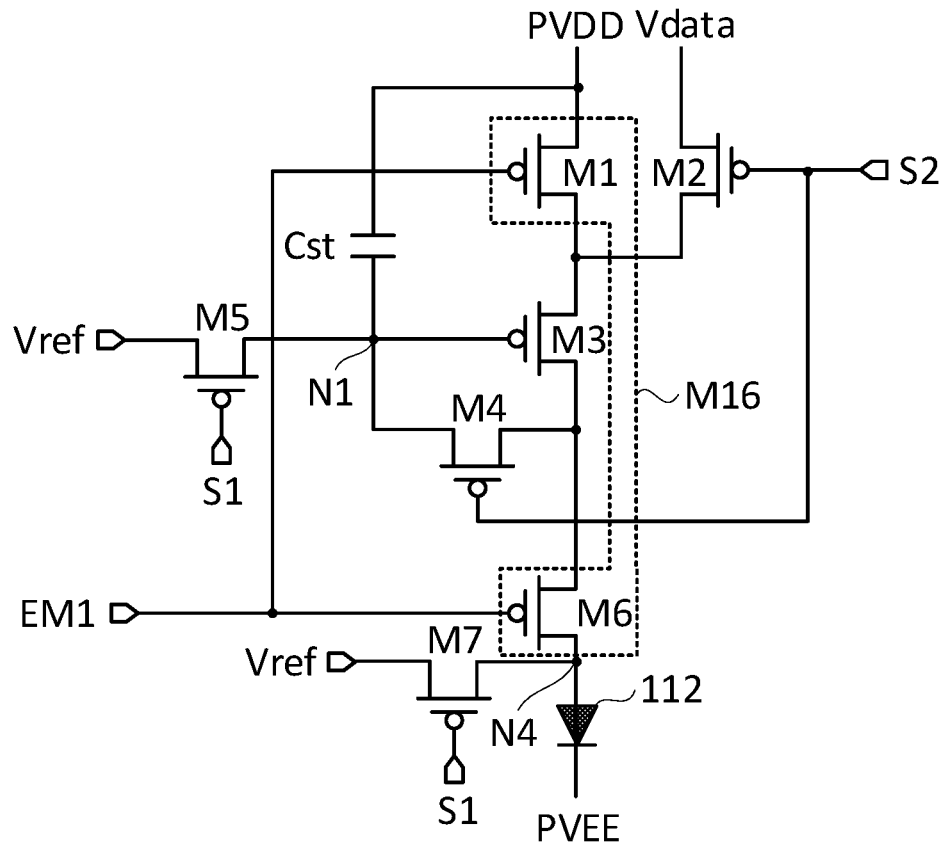
FIG. 5 is a diagram illustrating the structure of a pixel driving circuit in the related art.
Figure 6:
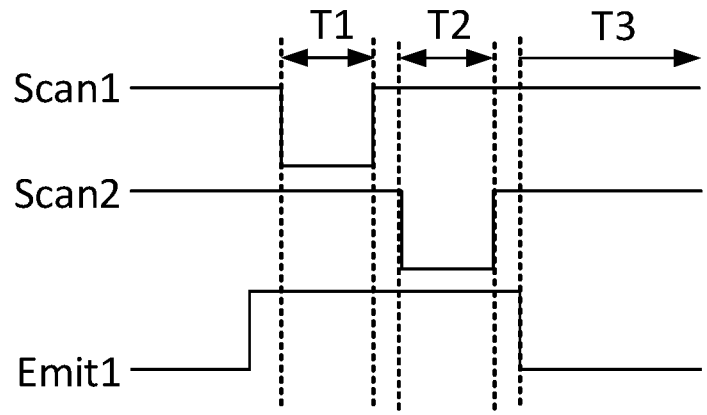
FIG. 6 is a drive timing diagram of a pixel driving circuit in the related art.

FIG. 5 is a diagram illustrating the structure of a pixel driving circuit in the related art. FIG. 6 is a drive timing diagram of a pixel driving circuit in the related art. As shown in FIG. 5 and FIG. 6, exemplarily, taking the pixel driving circuit 111 being a 7T1C circuit as an example, the pixel driving circuit 111 may further include a first reset transistor M5, a data write transistor M2, an additional transistor M4, a light-emitting reset transistor M7, and a first capacitor Cst.

The gate of the first reset transistor M5 is electrically connected to a first scan signal line S1. The first pole of the first reset transistor M5 is electrically connected to a reference signal line Vref. The second pole of the first reset transistor M5 and the gate of the drive transistor M3 are connected to a first node N1.

The gate of the data write transistor M2 is electrically connected to a second scan signal line S2. The first pole of the data write transistor M2 is electrically connected to a data signal line Vdata. The second pole of the data write transistor M2 is electrically connected to the first pole of the drive transistor M3.

The gate of the additional transistor M4 is electrically connected to the second scan signal line S2. The first pole of the additional transistor M4 is electrically connected to the second pole of the drive transistor M3. The second pole of the additional transistor M4 is electrically connected to the first node N1.

The gate of the light-emitting reset transistor M7 is connected to the first scan signal line S1. The first pole of the light-emitting reset transistor M7 is electrically connected to the reference signal line Vref. The second pole of the light-emitting reset transistor M7 is electrically connected to the anode of the light-emitting element 112.

One end of the first capacitor Cst is electrically connected to the first power signal line PVDD. Another end of the first capacitor Cst is electrically connected to the first node N1.

As shown in FIG. 5 and FIG. 6, the driving process of the pixel driving circuit 111 is, for example, as follows.

In an initialization stage T1, the first scan signal Scant on the first scan signal line S1 enables the first reset transistor M5 to be turned on. The reference voltage on the reference signal line Vref is applied to one end of the first capacitor Cst through the first reset transistor M5, that is, the potential of the first node N1 is the reference voltage, to reset the first node N1. At this time, the gate potential of the drive transistor M3 is also the reference voltage.

Meanwhile, in the initialization stage T1, the first scan signal Scant on the first scan signal line S1 enables the light-emitting reset transistor M7 to be turned on. The light-emitting reset transistor M7 writes the reference voltage on the reference signal line Vref into the anode of the light-emitting element 112 and resets the anode potential of the light-emitting element 112. Thus, the influence of the anode voltage of the light-emitting element 112 in the previous frame on the anode voltage of the light-emitting element 112 in the subsequent frame can be reduced, thereby contributing to the improvement of the display uniformity.

In a data signal voltage write stage T2, the second scan signal Scan2 on the second scan signal line S2 enables the data write transistor M2 and the additional transistor M4 to be turned on. At this time, the gate potential of the drive transistor M3 is the reference voltage. The drive transistor M3 is also turned on. The data signal voltage on the data signal line Vdata is applied to the first node N1 through the data write transistor M2, the drive transistor M3, and the additional transistor M4, thereby writing the data signal voltage into the first capacitor Cst.

In a light emission stage T3, the first light emission control signal Emit1 on the light emission control signal line EM1 enables the light emission control transistor M16 to be turned on. A current path is formed between the first power signal line PVDD, the light emission control transistor M16, the drive transistor M3, the light-emitting element 112, and the second power signal line PVEE. Thus, the drive current generated by the drive transistor M3 is supplied to the light-emitting element 112, thereby driving the light-emitting element 112 to emit light by the drive transistor M3 to implement the light-emitting and display functions of the display panel.

Figure 7:
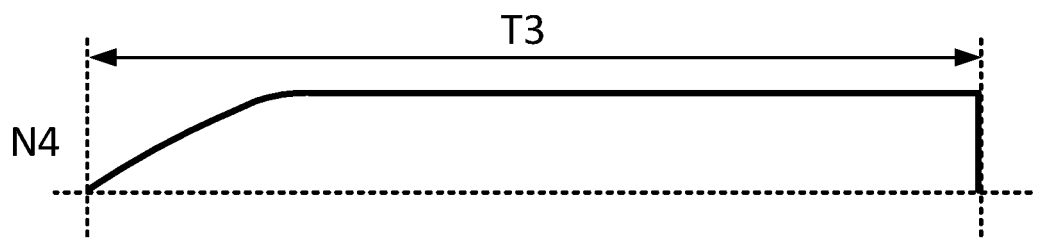
FIG. 7 is a potential diagram of an N4 node of a pixel driving circuit in a light emission stage in the related art.
Figure 8:
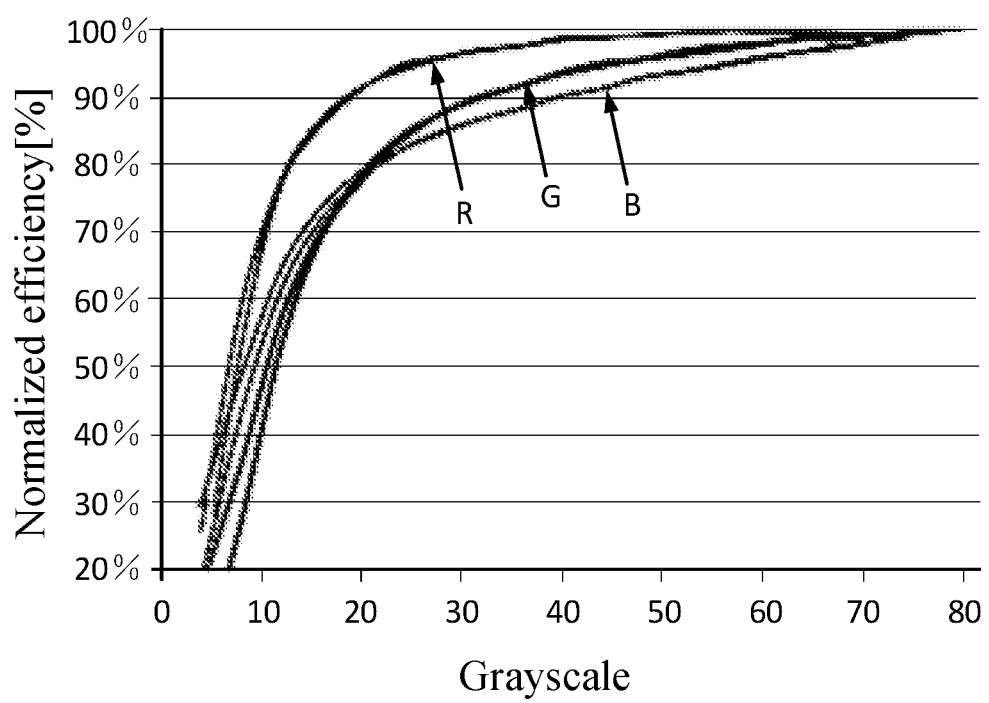
FIG. 8 is a luminescence efficiency graph of a sub-pixel in the related art.

FIG. 7 is a voltage diagram of an N4 node of a pixel driving circuit in a light emission stage in the related art. FIG. 8 is a luminescence efficiency graph of one sub-pixel in the related art. As shown in FIGS. 5 to 8, it is found that the first light emission control signal Emit1 on the light emission control signal line EM1 in the light emission stage T3 enables the light emission control transistor M16 to be turned on. The light-emitting element 112 has a pixel capacitor. After the light emission control transistor M16 is turned on, the pixel capacitor of the light-emitting element 112 is charged first. At this time, the anode potential of the light-emitting element 112 (that is, the potential of the N4 node) gradually rises. When the pixel capacitor of the light-emitting element 112 is fully charged, the light-emitting element 112 starts to emit light continuously.

Since light-emitting elements 112 emitting light of different colors have different materials of light-emitting layers 22, the light-emitting elements 112 emitting light of different colors have different pixel capacitors. A light-emitting element 112 having a smaller pixel capacitor needs a shorter time to charge the pixel capacitor of the light-emitting element 112 in the light emission stage T3. However, a light-emitting element 112 having a large pixel capacitor needs a longer time to charge the pixel capacitor of the light-emitting element 112 in the light emission stage T3. The light-emitting element 112 does not emit light before the pixel capacitor of the light-emitting element 112 is fully charged. Therefore, the longer the charging time of the pixel capacitor of the light-emitting element 112 in the limited duration of the light emission stage T3 within one frame, the later the light-emitting start time of the light-emitting element 112, and the shorter the light-emitting duration of the light-emitting element 112, so the luminescence efficiency of the light-emitting element 112 is lower. Similarly, the shorter the charging time of the pixel capacitor of the light-emitting element 112, the earlier the light-emitting start time of the light-emitting element 112, and the longer the light-emitting duration of the light-emitting element 112, so the luminescence efficiency of the light-emitting element 112 is higher.

Therefore, as shown in FIG. 8, light-emitting elements 112 (such as a red sub-pixel R, a green sub-pixel G, and a blue sub-pixel B in FIG. 8) emitting light of different colors have different charging time (or light-emitting time) of the light-emitting elements 112 to pixel capacitors in the light emission stage T3 due to the difference of the pixel capacitors of the light-emitting elements 112. Thus, the luminescence efficiency changes of the light-emitting elements 112 emitting light of different colors with low grayscale are quite different, thereby causing a color cast problem.

Based on the preceding technical problems, as shown in FIG. 3 and FIG. 4, in this embodiment, the cathode switch transistor M0 is connected in series between the cathode of the light-emitting element 112 and the second power signal line PVEE. The gate of the cathode switch transistor M0 is electrically connected to the second light emission control signal line EM2.

In at least one light emission stage T3 in the duration of one frame, the start time of an effective pulse of a second light emission control signal Emit2 of the second light emission control signal line EM2 lags behind the start time of an effective pulse of a first light emission control signal Emit1 of the first light emission control signal line EM1.

In this manner, as shown in FIG. 3 and FIG. 4, a light emission stage T3 includes a first light-emitting sub-stage T31 and a second light-emitting sub-stage T32 disposed in sequence. The first light-emitting sub-stage T31 is the time period between the start time of the effective pulse of the second light emission control signal Emit2 of the second light emission control signal line EM2 and the start time of the effective pulse of the first light emission control signal Emit1 of the first light emission control signal line EM1.

With continued reference to FIG. 3 and FIG. 4, in the first light-emitting sub-stage T31, the first light emission control signal Emit1 on the light emission control signal line EM1 is converted into an effective pulse. Thus, the light emission control transistor M16 is turned on. The second light emission control signal Emit2 on the second light emission control signal line EM2 controls the cathode switching transistor M0 to be turned off. At this time, a path between the anode of the light-emitting element 112 and the first power signal line PVDD is conductive. The drive current formed by the turn-on of the drive transistor M3 charges the pixel capacitor of the light-emitting element 112. A path between the cathode of the light-emitting element 112 and the second power signal line PVEE is not conductive. Therefore, in the first light-emitting sub-stage T31, the light-emitting element 112 does not emit light even if the pixel capacitor of the light-emitting element 112 is fully charged.

In the second light-emitting sub-stage T32, the first light emission control signal Emit1 on the light emission control signal line EM1 maintains an effective pulse. Thus, the light emission control transistor M16 maintains on. That is, the path between the anode of the light-emitting element 112 and the first power signal line PVDD maintains conductive. The second light emission control signal Emit2 on the second light emission control signal line EM2 is converted into an effective pulse so that the cathode switch transistor M0 is turned on. At this time, at the start time of the effective pulse of the second light emission control signal Emit2 of the second light emission control signal line EM2, the cathode switch transistor M0 is turned on. Thus, the path between the cathode of the light-emitting element 112 and the second power signal line PVEE is conductive. Pixel capacitors of light-emitting elements 112 emitting light of different colors have completed the charging process in the first light-emitting sub-stage T31, so that the light-emitting elements 112 emitting light of different colors can directly emit light when the cathode switch transistor M0 is turned on without having to go through the charging stage of the pixel capacitors. Thus, the light-emitting elements 112 emitting light of different colors start to emit light simultaneously in the light emission stage T3. That is, the light-emitting start time of the light-emitting elements 112 emitting light of different colors becomes consistent in the light emission stage T3, and thus the light-emitting duration of the light-emitting elements 112 emitting light of different colors becomes more consistent in the light emission stage T3. Moreover, the luminescence efficiency of the light-emitting elements 112 tends to be consistent, thereby solving the color cast problem caused by the difference in the pixel capacitors of the light-emitting elements 112 emitting light of different colors.

It is to be noted that the pixel driving circuit shown in FIG. 3 adds the cathode switch transistor M0 based on the 7T1C circuit shown in FIG. 5. However, the application of the cathode switch transistor M0 is not limited to the pixel driving circuit structures shown in FIG. 3 and FIG. 5. In other types of pixel driving circuit structures, the cathode switch transistor M0 may be connected in series to the cathode of a light-emitting element 112 so as to achieve that light-emitting elements 112 emitting light of different colors emit light simultaneously when the cathode switch transistor M0 is turned on, and thus the light-emitting duration and the luminescence efficiency of the light-emitting elements 112 emitting light of different colors tend to be consistent in the light emission stage T3, thereby solving the color cast problem caused by the difference in the pixel capacitors of the light-emitting elements 112 emitting light of different colors.

With continued reference to FIG. 3 and FIG. 5, optionally, at least one light emission control transistor M16 includes a first light emission control transistor M1 and a second light emission control transistor M6. The gate of the first light emission control transistor M1 is electrically connected to the first light emission control signal line EM1. The first pole of the first light emission control transistor M1 is electrically connected to the first power signal line PVDD. The second pole of the first light emission control transistor M1 is electrically connected to the first pole of the drive transistor M3. The gate of the second light emission control transistor M6 is electrically connected to the first light emission control signal line EM1. The first pole of the second light emission control transistor M6 is electrically connected to the second pole of the drive transistor M3. The second pole of the second light emission control transistor M6 is electrically connected to the light-emitting element 112.

The light emission control transistor M16 is set to include the first light emission control transistor M1 and the second light emission control transistor M6 so that in the non-light emission stage, the first light emission control transistor M1 and the second light emission control transistor M6 are cut off simultaneously under the action of the first light emission control signal Emit1 on the light emission control signal line EM1 to ensure the disconnection between the light-emitting element 112 and the first power signal line PVDD. Thus, it can be avoided that the light emission control transistor M16 generates the leakage current to cause the light-emitting element 112 to emit undesired light in the non-light emission stage to influence the display effect.

In summary, according to the display panel in this embodiment of the present disclosure, the light emission control transistor is connected in series between the anode of the light-emitting element and the first power signal line, and the cathode switch transistor is connected in series between the cathode of the light-emitting element and the second power signal line, the gate of the light emission control transistor is electrically connected to the first light emission control signal line, the gate of the cathode switch transistor is electrically connected to the second light emission control signal line, and in the light emission stage, the start time of the effective pulse of the second light emission control signal of the second light emission control signal line lags behind the start time of the effective pulse of the first light emission control signal of the first light emission control signal line. Thus, in the light emission stage, the light emission control transistor is first turned on so that the pixel capacitor of the light-emitting element is charged, and after the charging of pixel capacitors of light-emitting elements emitting light of different colors is completed, the cathode switch transistor is turned on. Therefore, the light-emitting elements emitting light of different colors emit light simultaneously when the cathode switch transistor is turned on so that the light-emitting duration and luminescence efficiency of the light-emitting elements emitting light of different colors tend to be consistent in the light emission stage, thereby solving the color cast problem caused by the difference in the pixel capacitors of the light-emitting elements emitting light of different colors.

With continued reference to FIGS. 1 to 4, optionally, emitted colors of at least part of sub-pixels 11 are different. Light-emitting elements 112 in the sub-pixels 11 have corresponding pixel capacitors. Capacitance values of the pixel capacitors of the light-emitting elements 112 in the sub-pixels 11 of different emitted colors are different. In at least one row of sub-pixels, a sub-pixel with the maximum capacitance value of the pixel capacitor of a light-emitting element 112 is the maximum capacitance sub-pixel. The charging time of the pixel capacitor of the light-emitting element 112 in the maximum capacitance sub-pixel is t1. For at least one row of sub-pixels 11, in the light emission stage T3, a duration in which the start time of an effective pulse of a second light emission control signal Emit2 of a second light emission control signal line EM2 corresponding to a sub-pixel 11 lags behind the start time of an effective pulse of a first light emission control signal Emit1 of a first light emission control signal line EM1 corresponding to the sub-pixel 11 is delay time. The delay time is $\Delta t$, and $\Delta t \geq t1$.

As described above, the display panel includes sub-pixels 11 of at least two different colors. As shown in FIG. 1, the display panel may include a red sub-pixel R, a green sub-pixel G, and a blue sub-pixel B. In some other embodiments, a white sub-pixel may further be included to implement color image display.

Pixel capacitors of light-emitting elements 112 emitting light of different colors have different capacitance values due to different materials of light-emitting layers 22 of the light-emitting elements 112.

With continued reference to FIGS. 1 to 4, the display panel includes multiple data signal lines Vdata and multiple second scan signal lines S2, the extension directions of the data signal lines Vdata and the second scan signal lines S2 intersect, and the multiple data signal lines Vdata and second scan signal lines S2 intersect to define multiple sub-pixels 11.

The multiple second scan signal lines S2 may extend along the row direction and may be arranged along the column direction. One second scan signal line S2 is disposed correspondingly and electrically connected to pixel driving circuits 111 of one row of sub-pixels 11. The multiple data signal lines Vdata may extend along the column direction and may be arranged along the row direction. One data signal line Vdata is disposed correspondingly and connected to pixel driving circuits 111 of one column of sub-pixels 11. A second scan signal line S2 is configured to provide a second scan signal Scan2 for pixel driving circuits 111 corresponding to one row of sub-pixels 11. Thus, the data signal on the data signal line Vdata can be written into the pixel driving circuits 111 corresponding to the one row of sub-pixels 11. The second scan signal Scan2 described herein refers to an effective pulse signal output from the second scan signal line S2. For example, in the structure of a pixel driving circuit 111 shown in FIG. 3, the second scan signal Scan2 output from the second scan signal line S2 is a signal capable of turning on the data write transistor M2 and the additional transistor M4. The second scan signal Scan2 is at a low level when the data write transistor M2 and the additional transistor M4 are positive channel metal oxide semiconductor (PMOS) transistors. The second scan signal Scan2 is at a high level when the data write transistor M2 and the additional transistor M4 are negative channel metal oxide semiconductor (NMOS) transistors.

Similarly, the first scan signal line S1, the light emission control signal line EM1, and the second light emission control signal line EM2 are disposed in a manner similar to the second scan signal line S2. That is, one signal line is disposed correspondingly and electrically connected to pixel driving circuits 111 of one row of sub-pixels 11, thereby providing a corresponding scan signal for the pixel driving circuits 111 in correspondence with the one row of sub-pixels 11.

Therefore, driving processes of pixel driving circuits 111 of the same row of sub-pixels 11 are performed simultaneously. That is, initialization stages T1, data signal voltage write stages T2, and light emission stages T3 (including first light-emitting sub-stages T31 and second light-emitting sub-stages T32) of the same row of sub-pixels 11 are performed simultaneously.

With continued reference to FIG. 1, in one row of sub-pixels 111, there may be sub-pixels 11 of at least two different colors, and capacitance values of pixel capacitors of light-emitting elements 112 in the sub-pixels 11 of different colors are different. In one row of sub-pixels 111, a sub-pixel 11 with the maximum capacitance value of the pixel capacitor of a light-emitting element 112 is the maximum capacitance sub-pixel in the one row of sub-pixels 111. As described above, the larger the capacitance value of the pixel capacitor of the light-emitting element 112, the longer the charging time of the pixel capacitor of the light-emitting element 112 in the light emission stage T3. Therefore, the sub-pixel 11 with the maximum capacitance value of the pixel capacitor of the light-emitting element 112 is the sub-pixel 11 with the longest charging time required in the light emission stage T3.

In this embodiment, the charging time of the pixel capacitor of the light-emitting element 112 in the maximum capacitance sub-pixel is t1. For any row of sub-pixels 11, in the light emission stage T3, a duration in which the start time of an effective pulse of a second light emission control signal Emit2 of a second light emission control signal line EM2 corresponding to a sub-pixel 11 lags behind the start time of an effective pulse of a first light emission control signal Emit1 of a first light emission control signal line EM1 corresponding to the sub-pixel 11 is delay time $\Delta t$. As shown in FIG. 4, the delay time $\Delta t$ is the duration of the first light-emitting sub-stage T31.

By setting the delay time $\Delta t$ to be greater than or equal to the charging time t1 of the pixel capacitor of the light-emitting element 112 in the maximum capacitance sub-pixel, it can be ensured that the charging of the pixel capacitor of the light-emitting element 112 in the maximum capacitance sub-pixel can be completed in the first light-emitting sub-stage T31. It is to be understood that one a row of sub-pixels 111, the pixel capacitance of the light-emitting element 112 in the maximum capacitance sub-pixel is maximum, and the charging time required in the light emission stage T3 is maximum, so that in the one row of sub-pixels 111, the charging time required for pixel capacitors of light-emitting elements 112 in sub-pixels 111 other than the maximum capacitance sub-pixel is each less than the charging time required for the pixel capacitor of the light-emitting element 112 in the maximum capacitance sub-pixel. Therefore, for the one row of sub-pixels 111, in the first light-emitting sub-stage T31, if the charging of the pixel capacitor of the light-emitting element 112 in the maximum capacitance sub-pixel can be completed, sub-pixels 111 in the one row of sub-pixels 111 other than the maximum capacitance sub-pixel can certainly complete the charging processes of the pixel capacitors in the light-emitting elements 112 in the first light-emitting sub-stage T31.

Therefore, in this embodiment, the delay time $\Delta t$ is set to be greater than or equal to the charging time t1 of the pixel capacitor of the light-emitting element 112 in the maximum capacitance sub-pixel for any row of sub-pixels 11, so that for any row of sub-pixels 11, the charging process of pixel capacitors of light-emitting elements 112 of all sub-pixels 11 in the row of sub-pixels 11 can be completed in the first light-emitting sub-stage T31, thereby ensuring that each row of sub-pixels 11 emits light simultaneously when a cathode switch transistor M0 correspondingly connected to the each row of sub-pixels 11 is turned on (that is, at the start time of the effective pulse of the second light emission control signal Emit2 of the second light emission control signal line EM2 or the start time of the second light-emitting sub-stage T32) without charging the pixel capacitors of the light-emitting elements 112 again. Therefore, the light-emitting start time of the light-emitting elements 112 emitting light of different colors in the same row of sub-pixels 11 is consistent in the light emission stage T3, and thus the light-emitting duration of the light-emitting elements 112 emitting light of different colors tends to be consistent in the light emission stage T3. Moreover, the luminescence efficiency of the light-emitting elements 112 tends to be consistent, thereby solving the color cast problem caused by the difference in the pixel capacitors of the light-emitting elements 112 emitting light of different colors.

With continued reference to FIGS. 1 to 4, optionally, multiple sub-pixels 11 include a first color sub-pixel 11a, a second color sub-pixel 11b, and a third color sub-pixel 11c. A capacitance value of a pixel capacitor of a light-emitting element 112 in the first color sub-pixel 11a is greater than a capacitance value of a pixel capacitor of a light-emitting element 112 in the second color sub-pixel 11b. The capacitance value of the pixel capacitor of the light-emitting element 112 in the second color sub-pixel 11b is greater than a capacitance value of a pixel capacitor of a light-emitting element 112 in the third color sub-pixel 11c. The charging time of the pixel capacitor of the light-emitting element 112 in the first color sub-pixel 11a is t2, and $\Delta t \geq t2$.

Specifically, as shown in FIG. 1, the display panel includes three types of sub-pixels 11 emitting light of different colors, respectively the first color sub-pixel 11a, the second color sub-pixel 11b, and the third color sub-pixel 11c, to implement color image display.

The first color sub-pixel 11a is a sub-pixel 11 having the maximum capacitance value of the pixel capacitor of the light-emitting element 112 among the three types of sub-pixels 11 emitting light of different colors. That is, the first color sub-pixel 11a is a sub-pixel 11 having the maximum capacitance value of the pixel capacitor of the light-emitting element 112 in the entire display panel. Moreover, the first color sub-pixel 11a is a sub-pixel 11 which requires the longest charging time in the light emission stage T3 in the entire display panel.

In this embodiment, the delay time Δt is set to be greater than or equal to the charging time t2 of the pixel capacitor of the light-emitting element 112 in the first color sub-pixel 11a, so that it can be ensured that each row of sub-pixels 11 completes the charging processes of the pixel capacitors of the light-emitting elements 112 in the each row of sub-pixels 11 in the first light-emitting sub-stage T31 regardless of sub-pixels 11 emitting light of which colors are included in each row of sub-pixels 11, thereby ensuring that each row of sub-pixels 11 emits light simultaneously when the cathode switch transistor M0 correspondingly connected to the each row of sub-pixels 11 is turned on (that is, at the start time of the effective pulse of the second light emission control signal Emit2 of the second light emission control signal line EM2 or the start time of the second light-emitting sub-stage T32) without charging the pixel capacitors of the light-emitting elements 112 again. Thus, the light-emitting start time of the light-emitting elements 112 emitting light of different colors in the same row of sub-pixels 11 is consistent in the light emission stage T3, and the light-emitting duration of the light-emitting elements 112 emitting light of different colors tends to be consistent in the light emission stage T3. Moreover, the luminescence efficiency of the light-emitting elements 112 tends to be consistent, thereby solving the color cast problem caused by the difference in the pixel capacitors of the light-emitting elements 112 emitting light of different colors.

Optionally, the delay time Δt corresponding to each row of sub-pixels 11 is equal.

As described above, when the delay time Δt is greater than or equal to the charging time t2 of the pixel capacitor of the light-emitting element 112 in the first color sub-pixel 11a, it can be ensured that each row of sub-pixels 11 completes the charging processes of the pixel capacitors of the light-emitting elements 112 in the each row of sub-pixels 11 in the first light-emitting sub-stage T31 regardless of sub-pixels 11 emitting light of which colors are included in each row of sub-pixels 11.

On this basis, the delay time Δt corresponding to each row of sub-pixels 11 is set to be equal, that is, the duration of the first light-emitting sub-stage T31 of each row of sub-pixels 11 in the driving process is equal. Thus, driving processes of pixel driving circuits 111 in each row of sub-pixels 11 are consistent.

At this time, as shown in FIG. 4, the second light emission control signal Emit2 of the second light emission control signal line EM2 may be a periodic pulse signal having the same waveform as the first light emission control signal Emit1 of the first light emission control signal line EM1. The second light emission control signal Emit2 may be provided for the second light emission control signal line EM2 through only one scan driving circuit. The scan driving circuit providing the second light emission control signal Emit2 may have the same circuit structure as the scan driving circuit providing the first light emission control signal Emit1. The output first light emission control signal Emit1 and second light emission control signal Emit2 are misaligned only in time. Thus, the design difficulty of the scan driving circuit providing the second light emission control signal Emit2 can be reduced, making it easy to implement.

Optionally, 2 μs≤Δt≤4 μs.

It is found that when the delay time Δt corresponding to each row of sub-pixels 11 is greater than or equal to 2 μs, it can be ensured that each row of sub-pixels 11 completes the charging processes of the pixel capacitors of the light-emitting elements 112 in the each row of sub-pixels 11 in the first light-emitting sub-stage T31 regardless of sub-pixels 11 emitting light of which colors are included in each row of sub-pixels 11, thereby ensuring that each row of sub-pixels 11 emits light simultaneously when the cathode switch transistor M0 correspondingly connected to the each row of sub-pixels 11 is turned on without charging the pixel capacitors of the light-emitting elements 112 again. Thus, the light-emitting start time of the light-emitting elements 112 emitting light of different colors in the same row of sub-pixels 11 is consistent in the light emission stage T3, and the light-emitting duration of the light-emitting elements 112 tends to be consistent in the light emission stage T3. Moreover, the luminescence efficiency of the light-emitting elements 112 tends to be consistent, thereby solving the color cast problem caused by the difference in the pixel capacitors of the light-emitting elements 112 emitting light of different colors.

Meanwhile, the delay time Δt corresponding to each row of sub-pixels 11 is set to be less than or equal to 4 μs. Thus, the duration of the first light-emitting sub-stage T31 is not too long to severely compress the duration (that is, the duration of the second light-emitting sub-stage T32) in which the light-emitting element 112 emits light in the light emission stage T3. Moreover, it can be ensured that the light-emitting element 112 has relatively long light-emitting time in the light emission stage T3, and the light-emitting element 112 has a relatively high luminescence efficiency.

Figure 9:
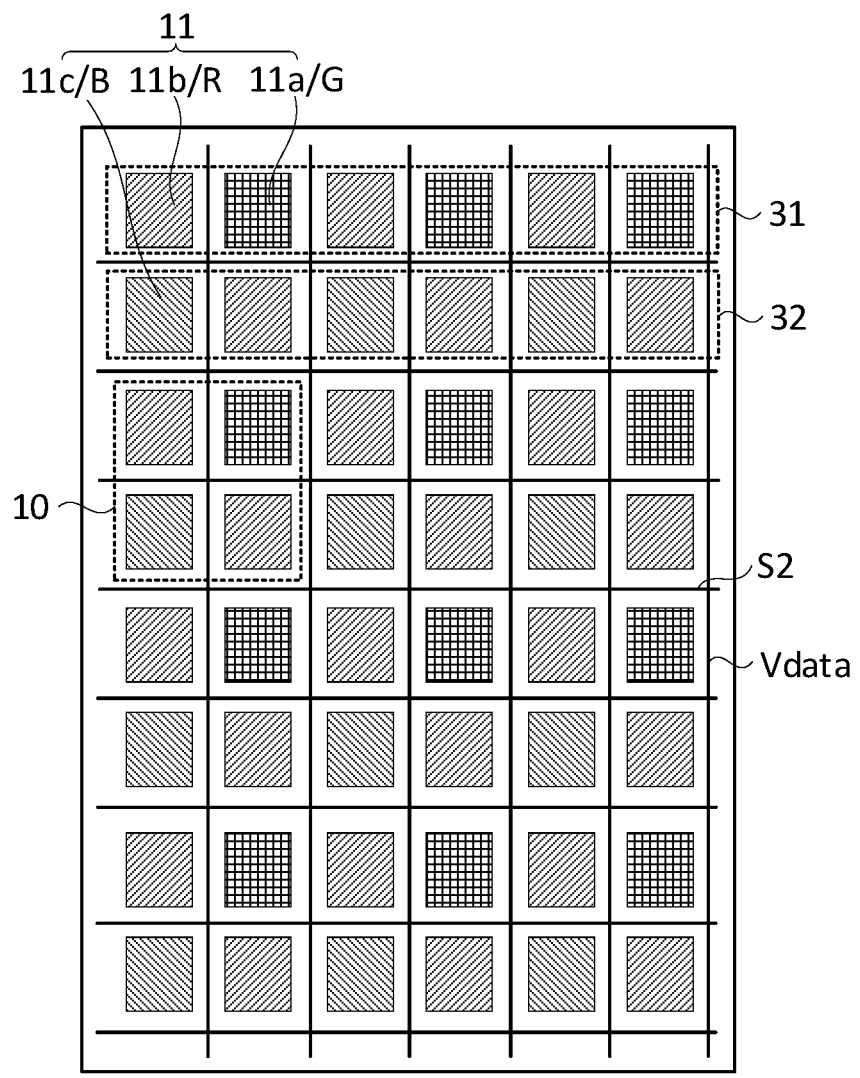
FIG. 9 is a diagram illustrating the structure of another display panel according to an embodiment of the present disclosure.
Figure 10:
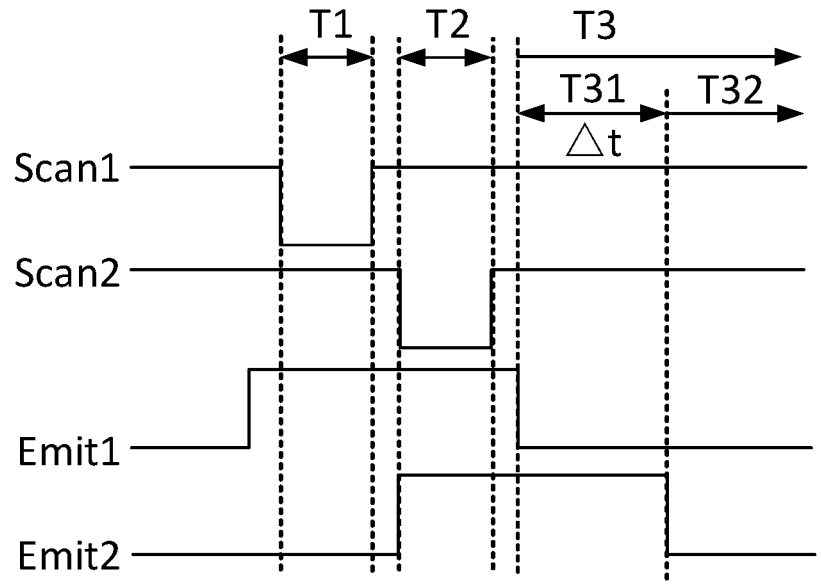
FIG. 10 is a drive timing diagram of a pixel driving circuit in a first sub-pixel row according to an embodiment of the present disclosure.
Figure 11:
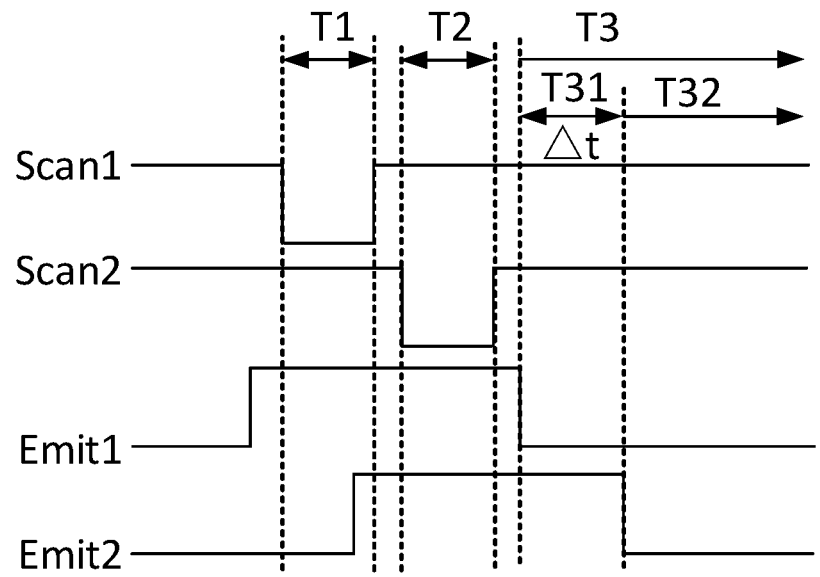
FIG. 11 is a drive timing diagram of a pixel driving circuit in a second sub-pixel row according to an embodiment of the present disclosure.

FIG. 9 is a diagram illustrating the structure of another display panel according to an embodiment of the present disclosure. FIG. 10 is a drive timing diagram of a pixel driving circuit in a first sub-pixel row according to an embodiment of the present disclosure. FIG. 11 is a drive timing diagram of a pixel driving circuit in a second sub-pixel row according to an embodiment of the present disclosure. Optionally, as shown in FIGS. 9 to 11, multiple sub-pixels 11 include first sub-pixel rows 31 and second sub-pixel rows 32. The maximum capacitance sub-pixel in a first sub-pixel row 31 and the maximum capacitance sub-pixel in a second sub-pixel row 32 have different emitted colors. The capacitance value of the pixel capacitor of the maximum capacitance sub-pixel in the first sub-pixel row 31 is greater than the capacitance value of the pixel capacitor of the maximum capacitance sub-pixel in the second sub-pixel row 32. The delay time Δt corresponding to the first sub-pixel row 31 is greater than the delay time Δt corresponding to the second sub-pixel row 32.

The display panel includes the first sub-pixel rows 31 and the second sub-pixel rows 32. Emitted colors of sub-pixels 11 included in the first sub-pixel row 31 are at least partially different from emitted colors of sub-pixels 11 included in the second sub-pixel row 32. This causes that the maximum capacitance sub-pixel in the first sub-pixel row 31 and the maximum capacitance sub-pixel in the second sub-pixel row 32 have different emitted colors.

Exemplarily, as shown in FIG. 9, the display panel includes first color sub-pixels 11a, second color sub-pixels 11b, and third color sub-pixels 11c, the capacitance value of the pixel capacitor of the light-emitting element 112 in a first color sub-pixel 11a is greater than the capacitance value of the pixel capacitor of the light-emitting element 112 in a second color sub-pixel 11b, and the capacitance value of the pixel capacitor of the light-emitting element 112 in the second color sub-pixel 11b is greater than the capacitance value of the pixel capacitor of the light-emitting element 112 in a third color sub-pixel 11c. The first sub-pixel row 31 is formed by arranging first color sub-pixels 11a and second color sub-pixels 11b. The second sub-pixel row 32 is formed by arranging second color sub-pixels 11b and third color sub-pixels 11c. The maximum capacitance sub-pixel in the first sub-pixel row 31 is the first color sub-pixel 11a. The maximum capacitance sub-pixel in the second sub-pixel row 32 is the second color sub-pixel 11b. In this case, the capacitance value of the pixel capacitor of the maximum capacitance sub-pixel (for example, the first color sub-pixel 11a in FIG. 9) in the first sub-pixel row 31 is greater than the capacitance value of the pixel capacitor of the maximum capacitance sub-pixel (for example, the second color sub-pixel 11b in FIG. 9) in the second sub-pixel row 32.

It is to be understood that in order for the first sub-pixel row 31 to complete the charging process of pixel capacitors of light-emitting elements 112 in all sub-pixels 11 in the row in the first light-emitting sub-stage T31, it is necessary to set the delay time Δt corresponding to the first sub-pixel row 31 to be greater than or equal to the charging time (for example, the charging time required for the pixel capacitor of the light-emitting element 112 in the first color sub-pixel 11a in FIG. 9) required for the pixel capacitor of the light-emitting element 112 of the maximum capacitance sub-pixel in the first sub-pixel row 31, and set the delay time Δt corresponding to the second sub-pixel row 32 to be greater than or equal to the charging time (for example, the charging time required for the pixel capacitor of the light-emitting element 112 in the second color sub-pixel 11b in FIG. 9) required for the pixel capacitor of the light-emitting element 112 of the maximum capacitance sub-pixel in the second sub-pixel row 32.

The capacitance value of the pixel capacitor of the maximum capacitance sub-pixel (for example, the first color sub-pixel 11a in FIG. 9) in the first sub-pixel row 31 is greater than the capacitance value of the pixel capacitor of the maximum capacitance sub-pixel (for example, the second color sub-pixel 11b in FIG. 9) in the second sub-pixel row 32, and thus, the charging time (for example, the charging time required for the pixel capacitor of the light-emitting element 112 in the first color sub-pixel 11a in FIG. 9) required for the pixel capacitor of the light-emitting element 112 of the maximum capacitance sub-pixel in the first sub-pixel row 31 is greater than the charging time (for example, the charging time required for the pixel capacitor of the light-emitting element 112 in the second color sub-pixel 11b in FIG. 9) required for the pixel capacitor of the light-emitting element 112 of the maximum capacitance sub-pixel in the second sub-pixel row 32.

Therefore, in this embodiment, as shown in FIG. 10 and FIG. 11, the delay time Δt corresponding to the first sub-pixel row 31 is set to be large to ensure that the delay time Δt corresponding to the first sub-pixel row 31 is greater than or equal to the charging time (for example, the charging time required for the pixel capacitor of the light-emitting element 112 in the first color sub-pixel 11a in FIG. 9) required for the pixel capacitor of the light-emitting element 112 of the maximum capacitance sub-pixel in the first sub-pixel row 31. Thus, it can ensure that the first sub-pixel row 31 completes the charging processes of pixel capacitors of light-emitting elements 112 in sub-pixels 11 in the row in the first light-emitting sub-stage T31 so that the sub-pixels 11 in the first sub-pixel row 31 can emit light simultaneously when the cathode switch transistor M0 correspondingly connected to the sub-pixels 11 is turned on.

Meanwhile, the delay time Δt corresponding to the second sub-pixel row 32 is set to be small. When it is ensured that the delay time Δt corresponding to the second sub-pixel row 32 is greater than or equal to the charging time (for example, the charging time required for the pixel capacitor of the light-emitting element 112 in the second color sub-pixel 11b in FIG. 9) required for the pixel capacitor of the light-emitting element 112 of the maximum capacitance sub-pixel in the second sub-pixel row 32, the light-emitting duration (that is, the duration of the second light-emitting sub-stage T32) of the light-emitting element 112 of the sub-pixel 11 in the second sub-pixel row 32 in the light emission stage T3 is greater than the light-emitting duration (that is, the duration of the second light-emitting sub-stage T32) of the light-emitting element 112 of the sub-pixel 11 in the first sub-pixel row 31 in the light emission stage T3. Thus, the luminescence efficiency of sub-pixels 11 in the second sub-pixel row 32 can be improved while the color cast problem caused by the difference in pixel capacitors of light-emitting elements 112 emitting light of different colors is solved. Moreover, a smaller working current density can be adopted under the condition of implementing the same brightness, which is helpful to prolong the service life of sub-pixels 11 in the second sub-pixel row 32.

Figure 12:
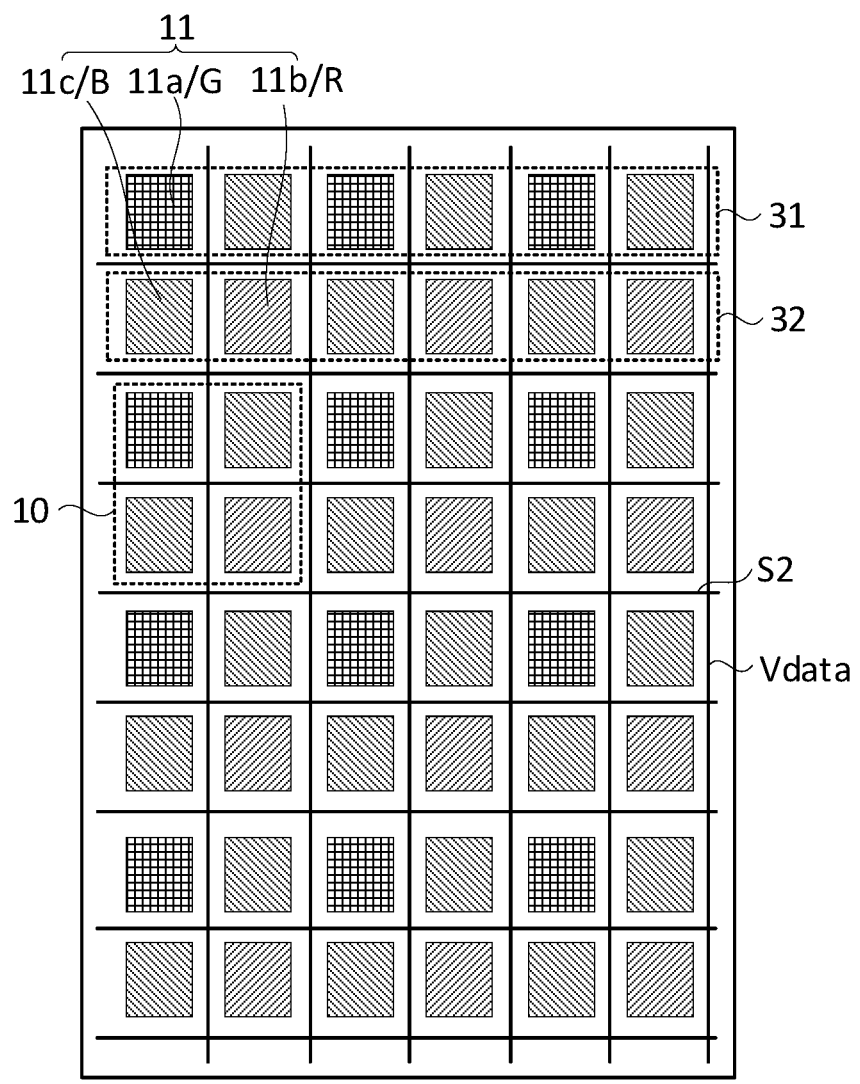
FIG. 12 is a diagram illustrating the structure of another display panel according to an embodiment of the present disclosure.

FIG. 12 is a diagram illustrating the structure of another display panel according to an embodiment of the present disclosure. As shown in FIGS. 9 to 12, optionally, first sub-pixel rows 31 and second sub-pixel rows 32 are alternately arranged along a column direction. Multiple sub-pixels 11 include first color sub-pixels 11a, second color sub-pixels 11b, and third color sub-pixels 11c. The capacitance value of the pixel capacitor of the light-emitting element 112 in a first color sub-pixel 11a is greater than the capacitance value of the pixel capacitor of the light-emitting element 112 in a second color sub-pixel 11b. The capacitance value of the pixel capacitor of the light-emitting element 112 in the second color sub-pixel 11b is greater than the capacitance value of the pixel capacitor of the light-emitting element 112 in a third color sub-pixel 11c. A first sub-pixel row 31 includes first color sub-pixels 11a and second color sub-pixels 11b. A second sub-pixel row 32 includes second color sub-pixels 11b and third color sub-pixels 11c. Alternatively, a first sub-pixel row 31 includes first color sub-pixels 11a and third color sub-pixels 11c. A second sub-pixel row 32 includes second color sub-pixels 11b and third color sub-pixels 11c. The delay time Δt corresponding to the first sub-pixel row 31 is greater than or equal to the charging time of the pixel capacitor of the light-emitting element 112 in a first color sub-pixel 11a. The delay time Δt corresponding to the second sub-pixel row 32 is greater than or equal to the charging time of the pixel capacitor of the light-emitting element 112 in a second color sub-pixel 11b.

Exemplarily, as shown in FIG. 9, first sub-pixel rows 31 and second sub-pixel rows 32 are alternately arranged along the column direction. A first sub-pixel row 31 may be formed by alternately arranging first color sub-pixels 11a and second color sub-pixels 11b along the row direction. A second sub-pixel row 32 may be formed by alternately arranging second color sub-pixels 11b and third color sub-pixels 11c along the row direction. Moreover, two adjacent sub-pixels 11 along the column direction have different emitted colors. For example, in FIG. 9, second color sub-pixels 11b and third color sub-pixels 11c are alternately arranged along the column direction. First color sub-pixels 11a and second color sub-pixels 11b are alternately arranged along the column direction.

In this case, as shown in FIG. 9, a 2×2 sub-pixel matrix formed by two second color sub-pixels 11b, one first color sub-pixel 11a, and one third color sub-pixel 11c which are disposed adjacently can constitute one pixel repetition unit 10. At the time of display, the second color sub-pixels 11b may be obtained by rendering the brightness of sub-pixels adjacent to the second color sub-pixels 11b and having different light-emitting colors from the second color sub-pixels 11b. With the preceding pixel arrangement and pixel rendering technique, by borrowing the brightness of surrounding sub-pixels, the display panel can reach a higher resolution with a smaller number of sub-pixels 11.

Similarly, as shown in FIG. 12, exemplarily, first sub-pixel rows 31 and second sub-pixel rows 32 are alternately arranged along the column direction. A first sub-pixel row 31 may be formed by alternately arranging first color sub-pixels 11a and third color sub-pixels 11c along the row direction. A second sub-pixel row 32 may be formed by alternately arranging second color sub-pixels 11b and third color sub-pixels 11c along the row direction. Moreover, two adjacent sub-pixels 11 along the column direction have different emitted colors. For example, in FIG. 12, first color sub-pixels 11a and third color sub-pixels 11c are alternately arranged along the column direction, and second color sub-pixels 11b and third color sub-pixels 11c are alternately arranged along the column direction.

In this case, as shown in FIG. 12, a 2×2 sub-pixel matrix formed by two third color sub-pixels 11c, one first color sub-pixel 11a, and one second color sub-pixel 11b which are disposed adjacently can constitute one pixel repetition unit 10. At the time of display, the third color sub-pixels 11c may be obtained by rendering the brightness of sub-pixels adjacent to the third color sub-pixels 11c and having different emitted colors from the third color sub-pixels 11c. With the preceding pixel arrangement and pixel rendering technique, by rendering the brightness of surrounding sub-pixels, the display panel can reach a higher resolution with a smaller number of sub-pixels 11.

In this embodiment, the maximum capacitance sub-pixel in a first sub-pixel row 31 is the first color sub-pixel 11a. By setting the delay time Δt corresponding to the first sub-pixel row 31 to be greater than or equal to the charging time of the pixel capacitor of the light-emitting element 112 in the first color sub-pixel 11a, it can be ensured that the first sub-pixel row 31 completes the charging processes of pixel capacitors of light-emitting elements 112 in all sub-pixels 11 in the row in the first light-emitting sub-stage T31. The maximum capacitance sub-pixel in a second sub-pixel row 32 is the second color sub-pixel 11b. By setting the delay time Δt corresponding to the second sub-pixel row 32 to be greater than or equal to the charging time of the pixel capacitor of the light-emitting element 112 in the second color sub-pixel 11b, it can be ensured that the second sub-pixel row 32 completes the charging processes of pixel capacitors of light-emitting elements 112 in all sub-pixels 11 in the row in the first light-emitting sub-stage T31, thereby ensuring that each row of sub-pixels 11 can emit light simultaneously when a cathode switch transistor M0 correspondingly connected to the each row of sub-pixels 11 is turned on. Thus, the light-emitting duration of light-emitting elements 112 emitting light of different colors in the same row of sub-pixels 11 is consistent in the light emission stage T3 so that the luminescence efficiency of the light-emitting elements 112 tends to be consistent, thereby solving the color cast problem caused by the difference in the pixel capacitors of the light-emitting elements 112 emitting light of different colors.

Meanwhile, as shown in FIG. 10 and FIG. 11, by setting the delay time Δt corresponding to the second sub-pixel row 32 to be less than the delay time Δt corresponding to the first sub-pixel row 31, it is possible to increase the light-emitting duration of light-emitting elements 112 of sub-pixels 11 in the second sub-pixel row 32 in the light emission stage T3 while the color cast problem caused by the difference in pixel capacitors of light-emitting elements 112 emitting light of different colors is solved, thereby improving the luminescence efficiency of sub-pixels 11 in the second sub-pixel row 32. Moreover, a smaller working current density can be adopted under the condition of implementing the same brightness, which is helpful to prolong the service life of sub-pixels 11 in the second sub-pixel row 32.

Figure 13:
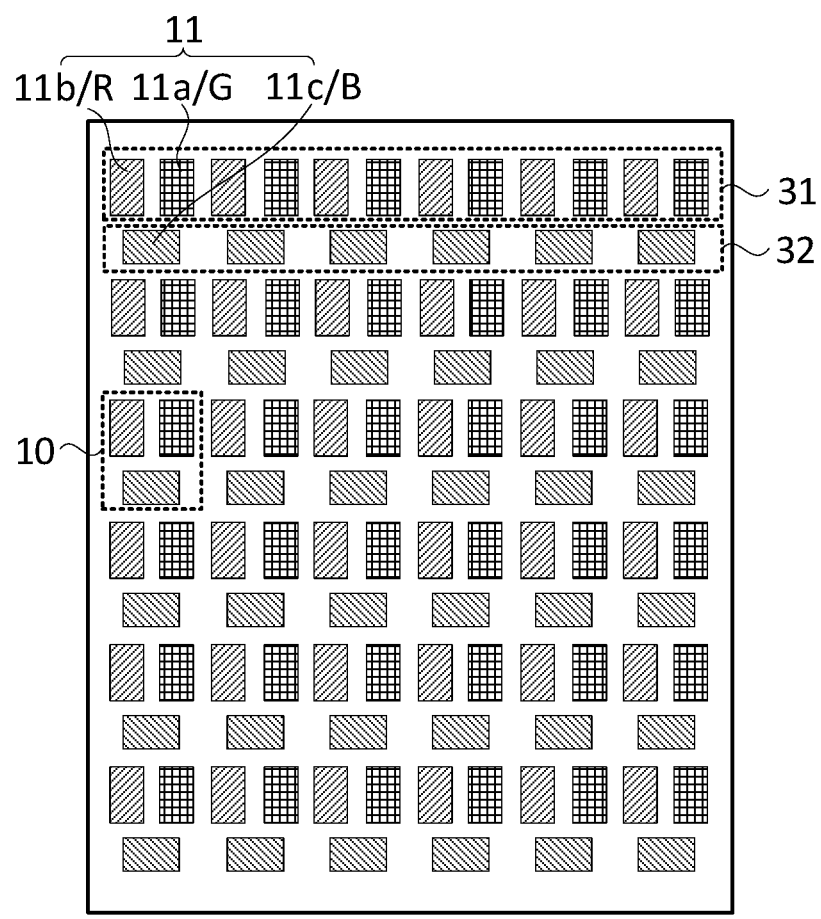
FIG. 13 is a diagram illustrating the structure of another display panel according to an embodiment of the present disclosure.
Figure 14:
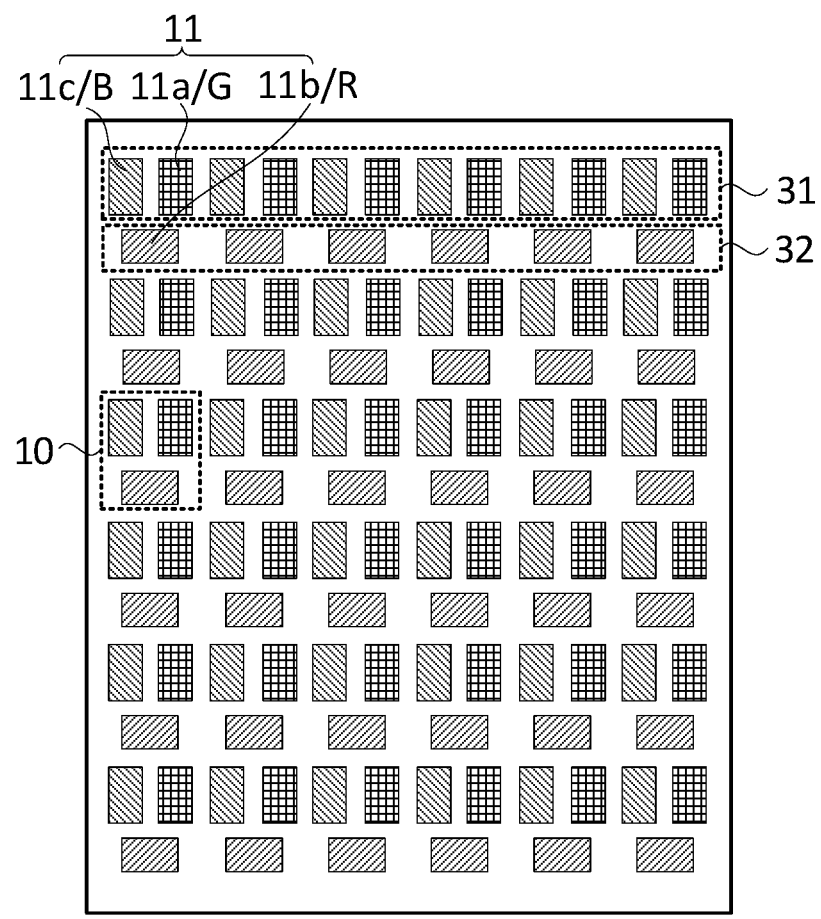
FIG. 14 is a diagram illustrating the structure of another display panel according to an embodiment of the present disclosure.
Figure 15:
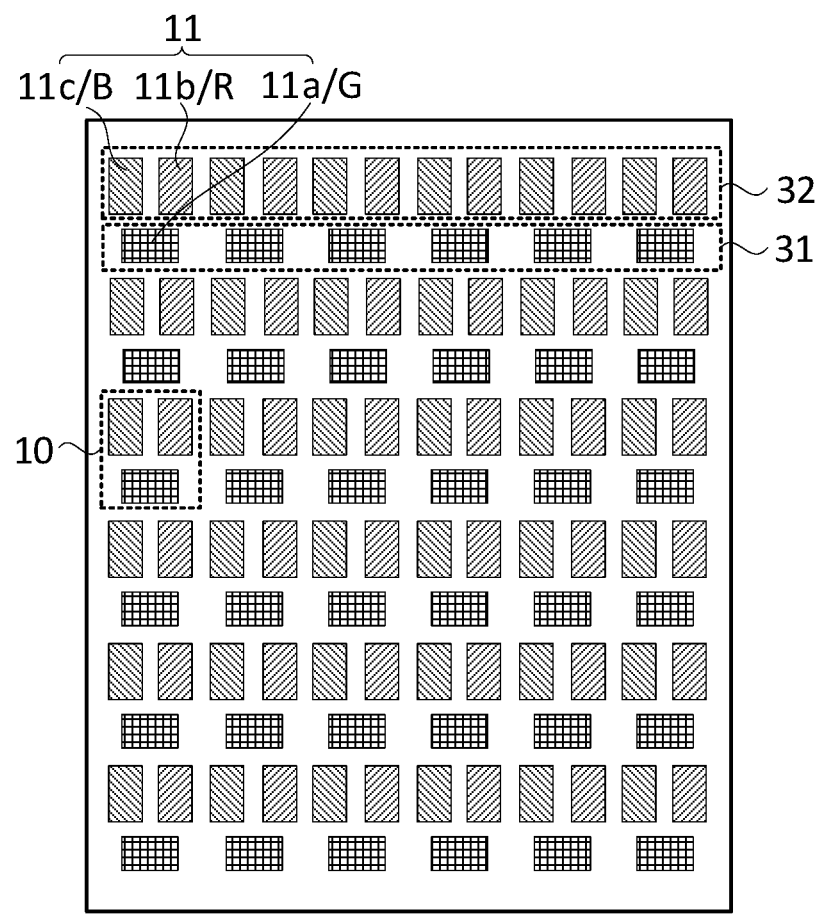
FIG. 15 is a diagram illustrating the structure of another display panel according to an embodiment of the present disclosure.

FIG. 13 is a diagram illustrating the structure of another display panel according to an embodiment of the present disclosure. FIG. 14 is a diagram illustrating the structure of another display panel according to an embodiment of the present disclosure. FIG. 15 is a diagram illustrating the structure of another display panel according to an embodiment of the present disclosure. As shown in FIGS. 13 to 15, optionally, first sub-pixel rows 31 and second sub-pixel rows 32 are alternately arranged along the column direction. Multiple sub-pixels 11 include first color sub-pixels 11a, second color sub-pixels 11b, and third color sub-pixels 11c. The capacitance value of the pixel capacitor of the light-emitting element 112 in a first color sub-pixel 11a is greater than the capacitance value of the pixel capacitor of the light-emitting element 112 in a second color sub-pixel 11b. The capacitance value of the pixel capacitor of the light-emitting element 112 in the second color sub-pixel 11b is greater than the capacitance value of the pixel capacitor of the light-emitting element 112 in a third color sub-pixel 11c. A first sub-pixel row 31 includes first color sub-pixels 11a and second color sub-pixels 11b. A second sub-pixel row 32 includes third color sub-pixels 11c. The delay time Δt corresponding to the first sub-pixel row 31 is greater than or equal to the charging time of the pixel capacitor of the light-emitting element 112 in a first color sub-pixel 11a. The delay time Δt corresponding to the second sub-pixel row 32 is greater than or equal to the charging time of the pixel capacitor of the light-emitting element 112 in a third color sub-pixel 11c. Alternatively, a first sub-pixel row 31 includes first color sub-pixels 11a and third color sub-pixels 11c. A second sub-pixel row 32 includes second color sub-pixels 11b. The delay time Δt corresponding to the first sub-pixel row 31 is greater than or equal to the charging time of the pixel capacitor of the light-emitting element 112 in a first color sub-pixel 11a. The delay time Δt corresponding to the second sub-pixel row 32 is greater than or equal to the charging time of the pixel capacitor of the light-emitting element 112 in a second color sub-pixel 11b. Alternatively, a first sub-pixel row 31 includes first color sub-pixels 11a. A second sub-pixel row 32 includes second color sub-pixels 11b and third color sub-pixels 11c. The delay time Δt corresponding to the first sub-pixel row 31 is greater than or equal to the charging time of the pixel capacitor of the light-emitting element 112 in a first color sub-pixel 11a. The delay time Δt corresponding to the second sub-pixel row 32 is greater than or equal to the charging time of the pixel capacitor of the light-emitting element 112 in a second color sub-pixel 11b.

Exemplarily, as shown in FIG. 13, first sub-pixel rows 31 and second sub-pixel rows 32 are alternately arranged along the column direction. A first sub-pixel row 31 may be formed by alternately arranging first color sub-pixels 11a and second color sub-pixels 11b along the row direction. A second sub-pixel row 32 may be formed by multiple third color sub-pixels 11c arranged along the row direction. A first color sub-pixel 11a, a second color sub-pixel 11b, and a third color sub-pixel 11c which are disposed adjacently can constitute one pixel repetition unit 10. In one pixel repetition unit 10, along the column direction, the third color sub-pixel 11c located in a second sub-pixel row 32 may at least separately partially overlap the first color sub-pixel 11a and the second color sub-pixel 11b which are located in a first sub-pixel row 31. In this arrangement manner, the arrangement of three pixels in the same pixel repetition unit 10 is more compact. Compared with the arrangement in which the first color sub-pixel 11a, the second color sub-pixel 11b, and the third color sub-pixel 11c are disposed in the same row in FIG. 1, this arrangement facilitates the improvement of the aperture ratio and screen-to-body ratio of the display panel, thereby facilitating the improvement of the display quality.

In this embodiment, as shown in FIG. 10, FIG. 11, and FIG. 13, the maximum capacitance sub-pixel in a first sub-pixel row 31 is the first color sub-pixel 11a. By setting the delay time Δt corresponding to the first sub-pixel row 31 to be greater than or equal to the charging time of the pixel capacitor of the light-emitting element 112 in the first color sub-pixel 11a, it can be ensured that the first sub-pixel row 31 completes the charging processes of pixel capacitors of light-emitting elements 112 in all sub-pixels 11 in the row in the first light-emitting sub-stage T31. The maximum capacitance sub-pixel in a second sub-pixel row 32 is the third color sub-pixel 11c. By setting the delay time Δt corresponding to the second sub-pixel row 32 to be greater than or equal to the charging time of the pixel capacitor of the light-emitting element 112 in the third color sub-pixel 11c, it can be ensured that the second sub-pixel row 32 completes the charging processes of pixel capacitors of light-emitting elements 112 in all sub-pixels 11 in the row in the first light-emitting sub-stage T31, thereby ensuring that each row of sub-pixels 11 can emit light simultaneously when a cathode switch transistor M0 correspondingly connected to the each row of sub-pixels 11 is turned on. Thus, the light-emitting duration of light-emitting elements 112 emitting light of different colors in the same row of sub-pixels 11 is consistent in the light emission stage T3 so that the luminescence efficiency of the light-emitting elements 112 tends to be consistent, thereby solving the color cast problem caused by the difference in the pixel capacitors of the light-emitting elements 112 emitting light of different colors.

In another embodiment, as shown in FIG. 14, first sub-pixel rows 31 and second sub-pixel rows 32 are alternately arranged along the column direction. A first sub-pixel row 31 may be formed by alternately arranging first color sub-pixels 11a and third color sub-pixels 11c along the row direction. A second sub-pixel row 32 may be formed by multiple second color sub-pixels 11b arranged along the row direction. A first color sub-pixel 11a, a second color sub-pixel 11b, and a third color sub-pixel 11c which are disposed adjacently can constitute one pixel repetition unit 10. In one pixel repetition unit 10, along the column direction, the second color sub-pixel 11b located in a second sub-pixel row 32 may at least separately partially overlap the first color sub-pixel 11a and the third color sub-pixel 11c which are located in a first sub-pixel row 31. In this arrangement manner, the arrangement of three pixels in the same pixel repetition unit 10 is more compact. Compared with the arrangement in which the first color sub-pixel 11a, the second color sub-pixel 11b, and the third color sub-pixel 11c are disposed in the same row in FIG. 1, this arrangement facilitates the improvement of the aperture ratio and screen-to-body ratio of the display panel, thereby facilitating the improvement of the display quality.

In this embodiment, as shown in FIG. 10, FIG. 11, and FIG. 14, the maximum capacitance sub-pixel in a first sub-pixel row 31 is the first color sub-pixel 11a. By setting the delay time Δt corresponding to the first sub-pixel row 31 to be greater than or equal to the charging time of the pixel capacitor of the light-emitting element 112 in the first color sub-pixel 11a, it can be ensured that the first sub-pixel row 31 completes the charging processes of pixel capacitors of light-emitting elements 112 in all sub-pixels 11 in the row in the first light-emitting sub-stage T31. The maximum capacitance sub-pixel in a second sub-pixel row 32 is the second color sub-pixel 11b. By setting the delay time Δt corresponding to the second sub-pixel row 32 to be greater than or equal to the charging time of the pixel capacitor of the light-emitting element 112 in the second color sub-pixel 11b, it can be ensured that the second sub-pixel row 32 completes the charging processes of pixel capacitors of light-emitting elements 112 in all sub-pixels 11 in the row in the first light-emitting sub-stage T31, thereby ensuring that each row of sub-pixels 11 can emit light simultaneously when a cathode switch transistor M0 correspondingly connected to the each row of sub-pixels 11 is turned on. Thus, the light-emitting duration of light-emitting elements 112 emitting light of different colors in the same row of sub-pixels 11 is consistent in the light emission stage T3 so that the luminescence efficiency of the light-emitting elements 112 tends to be consistent, thereby solving the color cast problem caused by the difference in the pixel capacitors of the light-emitting elements 112 emitting light of different colors.

In another embodiment, as shown in FIG. 15, first sub-pixel rows 31 and second sub-pixel rows 32 are alternately arranged along the column direction. A first sub-pixel row 31 may be formed by multiple first color sub-pixels 11a arranged along the row direction. A second sub-pixel row 32 may be formed by alternately arranging second color sub-pixels 11b and third color sub-pixels 11c along the row direction. A first color sub-pixel 11a, a second color sub-pixel 11b, and a third color sub-pixel 11c which are disposed adjacently can constitute one pixel repetition unit 10. In one pixel repetition unit 10, along the column direction, the first color sub-pixel 11a located in a first sub-pixel row 31 may at least separately partially overlap the second color sub-pixel 11b and the third color sub-pixel 11c which are located in a second sub-pixel row 32. In this arrangement manner, the arrangement of three pixels in the same pixel repetition unit 10 is more compact. Compared with the arrangement in which the first color sub-pixel 11a, the second color sub-pixel 11b, and the third color sub-pixel 11c are disposed in the same row in FIG. 1, this arrangement facilitates the improvement of the aperture ratio and screen-to-body ratio of the display panel, thereby facilitating the improvement of the display quality.

In this embodiment, as shown in FIG. 10, FIG. 11, and FIG. 15, the maximum capacitance sub-pixel in a first sub-pixel row 31 is the first color sub-pixel 11a. By setting the delay time Δt corresponding to the first sub-pixel row 31 to be greater than or equal to the charging time of the pixel capacitor of the light-emitting element 112 in the first color sub-pixel 11a, it can be ensured that the first sub-pixel row 31 completes the charging processes of pixel capacitors of light-emitting elements 112 in all sub-pixels 11 in the row in the first light-emitting sub-stage T31. The maximum capacitance sub-pixel in a second sub-pixel row 32 is the second color sub-pixel 11b. By setting the delay time Δt corresponding to the second sub-pixel row 32 to be greater than or equal to the charging time of the pixel capacitor of the light-emitting element 112 in the second color sub-pixel 11b, it can be ensured that the second sub-pixel row 32 completes the charging processes of pixel capacitors of light-emitting elements 112 in all sub-pixels 11 in the row in the first light-emitting sub-stage T31, thereby ensuring that each row of sub-pixels 11 can emit light simultaneously when a cathode switch transistor M0 correspondingly connected to the each row of sub-pixels 11 is turned on. Thus, the light-emitting duration of light-emitting elements 112 emitting light of different colors in the same row of sub-pixels 11 is consistent in the light emission stage T3 so that the luminescence efficiency of the light-emitting elements 112 tends to be consistent, thereby solving the color cast problem caused by the difference in the pixel capacitors of the light-emitting elements 112 emitting light of different colors.

Meanwhile, as shown in FIG. 10 and FIG. 11, in the display panel shown in FIGS. 13 to 15, by setting the delay time Δt corresponding to the second sub-pixel row 32 to be less than the delay time Δt corresponding to the first sub-pixel row 31, the light-emitting duration of light-emitting elements 112 of sub-pixels 11 in the second sub-pixel row 32 in the light emission stage T3 can be increased while the color cast problem caused by the difference in pixel capacitors of light-emitting elements 112 emitting light of different colors is solved, thereby improving the luminescence efficiency of sub-pixels 11 in the second sub-pixel row 32. Moreover, a smaller working current density can be adopted under the condition of implementing the same brightness, which is helpful to prolong the service life of sub-pixels 11 in the second sub-pixel row 32.

It is to be noted that in the preceding embodiments, only the setting manners of the delay time Δt corresponding to each row of sub-pixels 11 in several pixel arrangement manners are illustrated by example. However, this is not limited to the preceding embodiments. It is to be understood that those skilled in the art can adjust the delay time Δt corresponding to each row of sub-pixels 11 according to a specific pixel arrangement manner to implement the desired result of the technical solution of the present disclosure.

With continued reference to FIGS. 1, 9, and 12 to 15, optionally, the first color sub-pixel 11a is a green sub-pixel G, the second color sub-pixel 11b is a red sub-pixel R, and the third color sub-pixel 11c is a blue sub-pixel B.

It is further found that the capacitance value of the pixel capacitor of the light-emitting element 112 in the green sub-pixel G is greater than the capacitance value of the pixel capacitor of the light-emitting element 112 in the red sub-pixel R, and the capacitance value of the pixel capacitor of the light-emitting element 112 in the red sub-pixel R is greater than the capacitance value of the pixel capacitor of light-emitting element 112 in the blue sub-pixel B. Thus, in the light emission stage T3, the time required for charging the pixel capacitor of the light-emitting element 112 in the blue sub-pixel B is shorter, while the time required for charging the pixel capacitor of the light-emitting element 112 in the green sub-pixel G is longer, so that in the limited duration of the light emission stage T3 within a frame, the light-emitting duration of the light-emitting element 112 in the blue sub-pixel B is longer, and the light-emitting duration of the light-emitting element 112 in the green sub-pixel G is shorter. This results that the luminescence efficiency of the blue sub-pixel B is higher under low grayscale, the luminescence efficiency of the green sub-pixel G is lower under low grayscale, and the image is bluish.

Therefore, in any one of the preceding embodiments, by setting the green sub-pixel G as the first color sub-pixel 11a, the red sub-pixel R as the second color sub-pixel 11b, and the blue sub-pixel B as the third color sub-pixel 11c, the color cast problem caused by sequential reduction of the capacitance values of the pixel capacitors of the light-emitting elements 112 in the green sub-pixel G, red sub-pixel R, and blue sub-pixel B can be solved.

It is to be noted that the capacitance value of the pixel capacitor of the light-emitting element 112 depends on the material of the light-emitting layer 22 in the light-emitting element 112. Therefore, when materials of light-emitting layers 22 in the light-emitting elements 112 in the green sub-pixel G, red sub-pixel R, and blue sub-pixel B use other material systems, the capacitance values of the pixel capacitors of the light-emitting elements 112 in the green sub-pixel G, red sub-pixel R, and blue sub-pixel B may present a different magnitude relationship from this embodiment. Thus, the green sub-pixel G, the red sub-pixel R, and the blue sub-pixel B have a different correspondence relationship with the first color sub-pixel 11a, the second color sub-pixel 11b, and the third color sub-pixel 11c in the preceding embodiments. The details are not repeated here.

Figure 16:
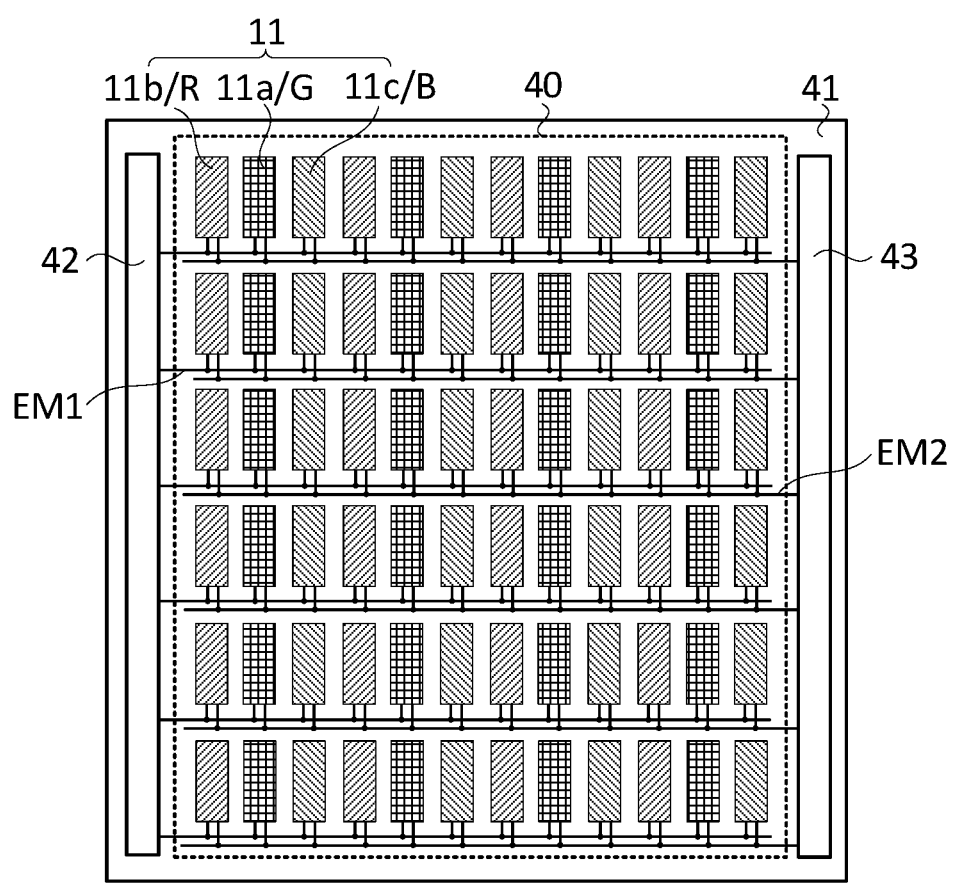
FIG. 16 is a diagram illustrating the structure of another display panel according to an embodiment of the present disclosure.

FIG. 16 is a diagram illustrating the structure of another display panel according to an embodiment of the present disclosure. As shown in FIG. 16, optionally, the display panel provided in this embodiment of the present disclosure includes a display region 40 and a non-display region 41 located on at least one side of the display region 40. The non-display region 41 includes a first scan driving circuit 42 and a second scan driving circuit 43. First light emission control signal lines EM1 are electrically connected to the first scan driving circuit 42. Second light emission control signal lines EM2 are electrically connected to the second scan driving circuit 43.

Specifically, as shown in FIG. 16, the first scan driving circuit 42 and the second scan driving circuit 43 are disposed in the non-display region 41 to prevent the first scan driving circuit 42 and the second scan driving circuit 43 from influencing the image display of the display region 40. The first scan driving circuit 42 is configured to sequentially provide a first light emission control signal Emit1 for a first light emission control signal line EM1 in each row, thereby controlling light emission control transistors M16 of pixel driving circuits 111 in each row of sub-pixels 11 to be turned on. The second scan driving circuit 43 is configured to sequentially provide a second light emission control signal Emit2 for a second light emission control signal line EM2 in each row, thereby controlling cathode switch transistors M0 of pixel driving circuits 111 in each row of sub-pixels 11 to be turned on.

In this embodiment, the first light emission control signal Emit1 of the first light emission control signal line EM1 and the second light emission control signal Emit 2 of the second light emission control signal line EM2 are provided through two different scan driving circuits (for example, the first scan driving circuit 42 and the second scan driving circuit 43 in FIG. 16), respectively. The turn-on time of the light emission control transistor M16 of a pixel driving circuit 111 in each row and the turn-on time of the cathode switch transistor M0 of the pixel driving circuit 111 in each row can be independently controlled through two different scan driving circuits in a one-to-one manner. Thus, the delay time Δt corresponding to each row of sub-pixels 11 can be flexibly adjusted according to specific capacitance values of pixel capacitors of light-emitting elements 112 in sub-pixels 11 emitting light of different colors so that the delay time Δt corresponding to each row of sub-pixels 11 has a large settable range, thereby being applicable to light-emitting elements 112 of various different material systems.

With continued reference to FIG. 16, optionally, the first scan driving circuit 42 and the second scan driving circuit 43 may be located on different sides of the display region 40. Thus, the width of the bezel at a single side can be reduced, thereby facilitating the narrow bezel design of the display panel.

Figure 17:
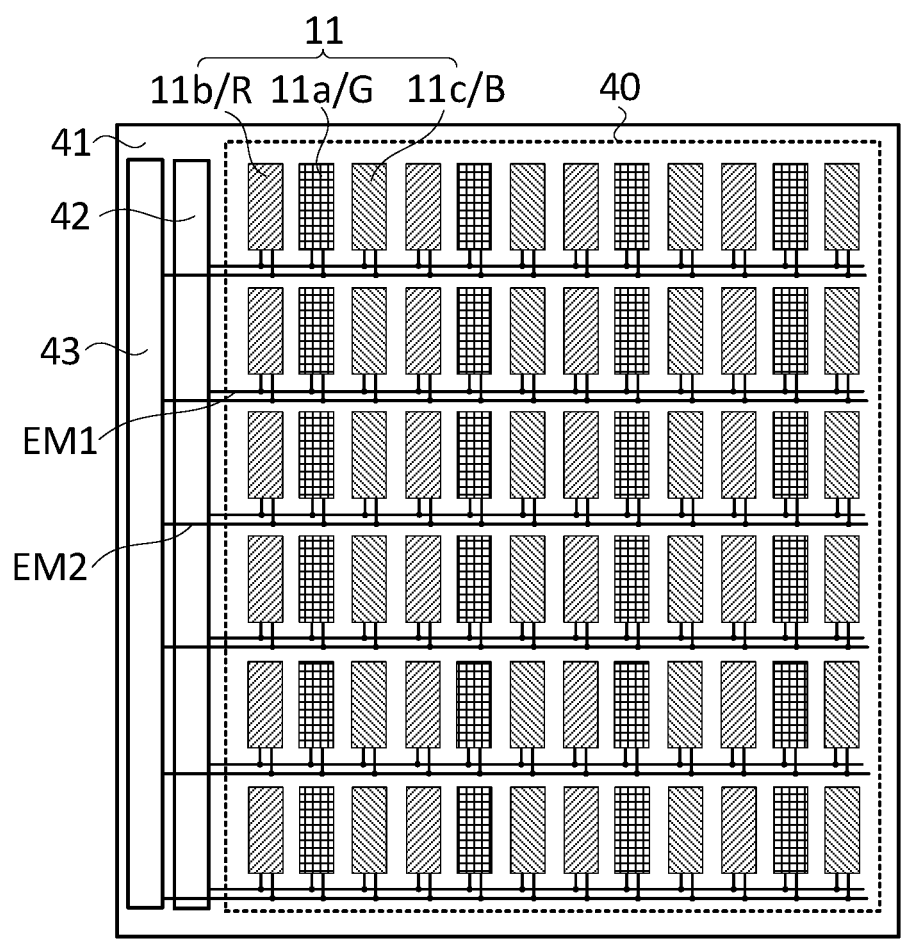
FIG. 17 is a diagram illustrating the structure of another display panel according to an embodiment of the present disclosure.

FIG. 17 is a diagram illustrating the structure of another display panel according to an embodiment of the present disclosure. As shown in FIG. 17, optionally, a first scan driving circuit 42 and a second scan driving circuit 43 may be located on the same side of a display region 40. In this case, a first light emission control signal Emit1 provided by the first scan driving circuit 42 and a second light emission control signal Emit2 provided by the second scan driving circuit 43 are transmitted from the same side of the display region 40 to the light emission control transistor M16 and the cathode switch transistor M0 of a pixel driving circuit 111 at each position in the same row. Thus, the time difference (that is, the delay time Δt or the duration of a first light-emitting sub-stage T31) between receiving the first light emission control signal Emit1 and the second light emission control signal Emit2 by a pixel driving circuit 111 at each position in the same row can be kept consistent, thereby ensuring that the light-emitting duration of sub-pixels 11 in the same row is consistent in the light emission stage T3, and the luminescence efficiency of light-emitting elements 112 is more consistent to further improve the color cast problem.

Figure 18:
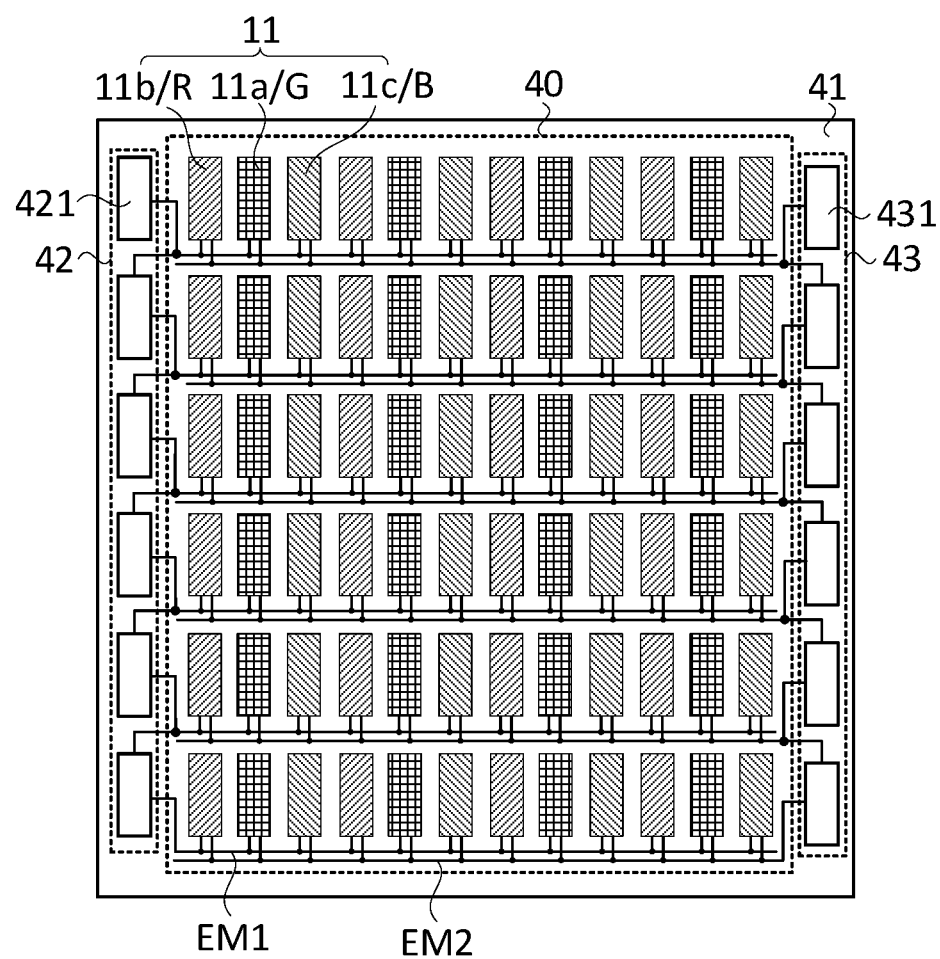
FIG. 18 is a diagram illustrating the structure of another display panel according to an embodiment of the present disclosure.

FIG. 18 is a diagram illustrating the structure of another display panel according to an embodiment of the present disclosure. As shown in FIG. 18, optionally, the delay time Δt corresponding to each row of sub-pixels 11 is equal. The display panel includes N rows of sub-pixels 11. A first scan driving circuit 42 includes N cascaded first shift registers 421. A second scan driving circuit 43 includes N cascaded second shift registers 431. A first light emission control signal line EM1 corresponding to sub-pixels 11 in the i-th row is electrically connected to a first shift register 421 in the i-th stage. A second light emission control signal line EM2 corresponding to sub-pixels 11 in the i-th row is electrically connected to a second shift register 431 in the i-th stage. $1 \leq i \leq N$, and i is a positive integer.

Exemplarily, as shown in FIG. 18, N=6 is taken as an example for illustration. The display panel includes 6 rows of sub-pixels 11. The first scan driving circuit 42 includes 6 cascaded first shift registers 421. The 6 first shift registers 421 are electrically connected to 6 first light emission control signal lines EM1 correspondingly connected to the 6 rows of sub-pixels 11 in a one-to-one manner. During one frame, a first shift register 421 in the 1st stage outputs a first light emission control signal Emit1 to the 1st first light emission control signal line EM1. Thus, light emission control transistors M16 of pixel driving circuits 111 in the sub-pixels 11 in the 1st row are turned on. Meanwhile, the first light emission control signal Emit1 output from the first shift register 421 in the 1st stage also serves as a shift control signal of a first shift register 421 in the 2nd stage. That is, the first shift register 421 in the 1st stage outputs the shift control signal to the first shift register 421 in the 2nd stage while outputting the first light emission control signal Emit1 to the 1st first light emission control signal line EM1. Then, under the drive of the shift control signal, the first shift register 421 in the 2nd stage outputs the first light emission control signal Emit1 to the 2nd first light emission control signal line EM1. Thus, light emission control transistors M16 of pixel driving circuits 111 in the sub-pixels 11 in the 2nd row are turned on. Meanwhile, the shift control signal is output to a first shift register 421 in the 3rd stage. By analogy, under the drive of the shift control signal, a first shift register 421 in the N-th stage outputs the first light emission control signal Emit1 to the N-th first light emission control signal line EM1. Thus, light emission control transistors M16 of pixel driving circuits 111 in the sub-pixels 11 in the N-th row are turned on, thereby implementing the row-by-row turn-on of light emission control transistors M16 in the N rows of sub-pixels 11.

Similarly, with continued reference to FIG. 18, the second scan driving circuit 43 includes 6 cascaded second shift registers 431. The 6 second shift registers 431 are electrically connected to 6 second light emission control signal lines EM2 correspondingly connected to the 6 rows of sub-pixels 11 in a one-to-one manner. During one frame, a second shift register 431 in the 1st stage outputs a second light emission control signal Emit2 to the 1st second light emission control signal line EM2. Thus, a cathode switch transistor M0 correspondingly connected to the sub-pixels 11 in the 1st row is turned on. Meanwhile, the second light emission control signal Emit2 output from the second shift register 431 in the 1st stage also serves as a shift control signal of a second shift register 431 in the 2nd stage. That is, the second shift register 431 in the 1st stage outputs the shift control signal to the second shift register 431 in the 2nd stage while outputting the second light emission control signal Emit2 to the 1st second light emission control signal line EM2. Then, under the drive of the shift control signal, the second shift register 431 in the 2nd stage outputs the second light emission control signal Emit2 to the 2nd second light emission control signal line EM2. Thus, a cathode switch transistor M0 correspondingly connected to the sub-pixels 11 in the 2nd row is turned on. Meanwhile, the shift control signal is output to a second shift register 431 in the 3rd stage. By analogy, under the drive of the shift control signal, a second shift register 431 in the N-th stage outputs the second light emission control signal Emit2 to the N-th second light emission control signal line EM2. Thus, a cathode switch transistor M0 correspondingly connected to the sub-pixels 11 in the N-th row is turned on, thereby implementing the row-by-row turn-on of cathode switch transistors M0 correspondingly connected to N rows of sub-pixels 11.

The turn-on time of the light emission control transistor M16 of a pixel driving circuit 111 in each row and the turn-on time of the cathode switch transistor M0 of the pixel driving circuit 111 in each row can be independently controlled through the first scan driving circuit 42 and the second scan driving circuit 43, respectively. Thus, the delay time Δt corresponding to each row of sub-pixels 11 can be flexibly adjusted according to specific capacitance values of pixel capacitors of light-emitting elements 112 in sub-pixels 11 emitting light of different colors so that the delay time Δt corresponding to each row of sub-pixels 11 has a large settable range, thereby being applicable to light-emitting elements 112 of various different material systems.

It is to be noted that when the delay time Δt corresponding to each row of sub-pixels 11 is equal, only one set of N cascaded first shift registers 421 is required to implement the output of the first light emission control signal Emit1. Similarly, only one set of N cascaded second shift registers 431 is required to implement the output of the second light emission control signal Emit2. In this manner, the progressive turn-on of light emission control transistors M16 in the N rows of sub-pixels 11 and the row-by-row turn-on of cathode switch transistors M0 correspondingly connected to the N rows of sub-pixels 11 can be implemented through fewer shift registers, thereby reducing the width of the bezel and facilitating the narrow bezel design of the display panel.

In addition, in practical application, the display panel has more rows of sub-pixels 11, that is, N may be a larger value. The value of N is related to the size and resolution of the display panel and may be set according to actual requirements. The details are not repeated in subsequent embodiments.

Figure 19:
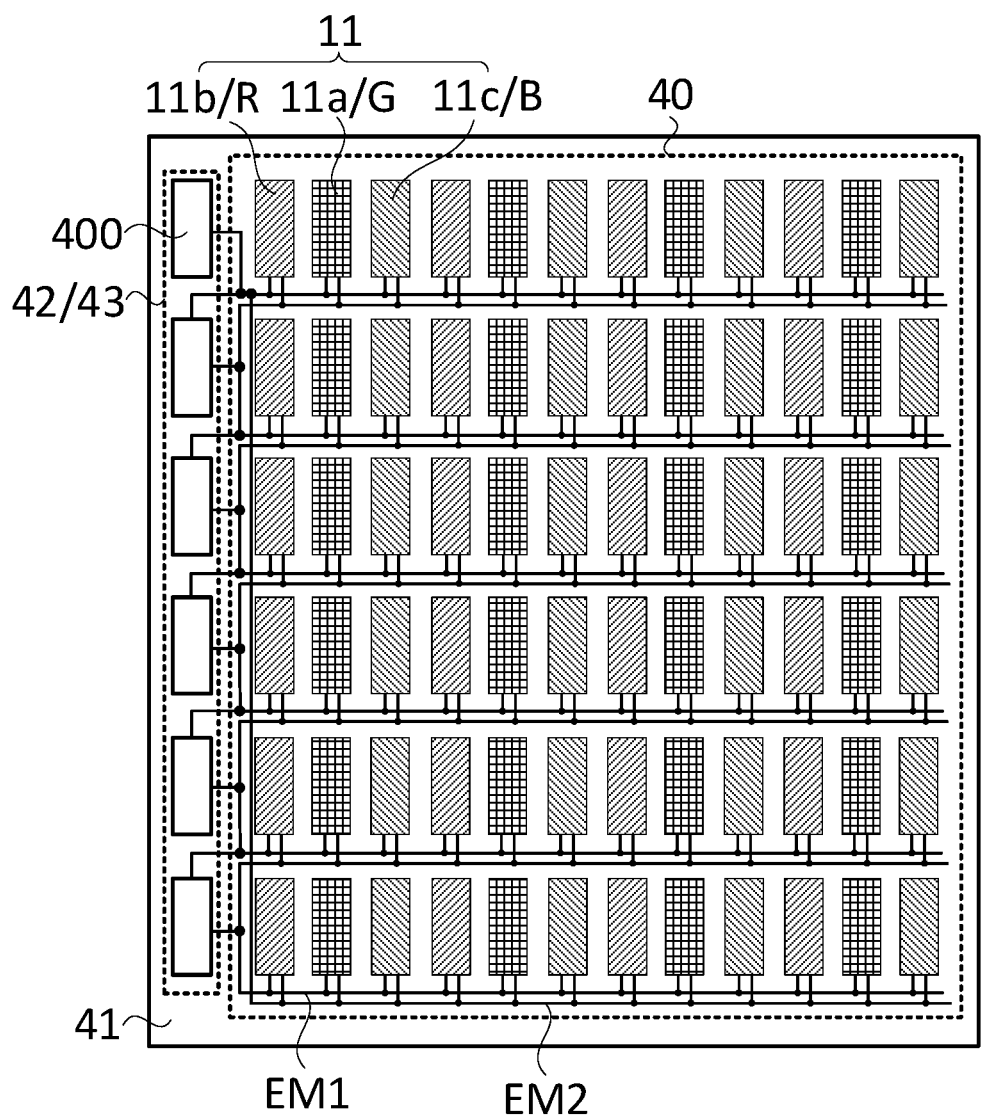
FIG. 19 is a diagram illustrating the structure of another display panel according to an embodiment of the present disclosure.

FIG. 19 is a diagram illustrating the structure of another display panel according to an embodiment of the present disclosure. As shown in FIG. 19, optionally, the delay time Δt corresponding to each row of sub-pixels 11 is equal. The display panel includes N rows of sub-pixels 11. A first scan driving circuit 42 and a second scan driving circuit 43 are the same scan driving circuit. The scan driving circuit includes N cascaded third shift registers 400. A first light emission control signal line EM1 corresponding to sub-pixels 11 in the i-th row is electrically connected to a third shift register 400 in the i-th stage. A first light emission control signal line EM1 corresponding to sub-pixels 11 in the N-th row is electrically connected to a third shift register 400 in the N-th stage. A second light emission control signal line EM2 corresponding to sub-pixels 11 in the i-th row is electrically connected to a third shift register 400 in the (i+1)-th stage. A second light emission control signal line EM2 corresponding to sub-pixels 11 in the N-th row is electrically connected to a third shift register 400 in the 1st stage. 1≤i≤N−1, and i is a positive integer.

Exemplarily, as shown in FIG. 19, N=6 is taken as an example for description. The display panel includes 6 rows of sub-pixels 11. The first scan driving circuit 42 and the second scan driving circuit 43 are the same scan driving circuit. That is, the first scan driving circuit 42 and the second scan driving circuit 43 share the same set of 6 cascaded third shift registers 400. The 6 third shift registers 400 are electrically connected to 6 first light emission control signal lines EM1 correspondingly connected to 6 rows of sub-pixels 11 in a one-to-one manner. The 6 third shift registers 400 are electrically connected to 6 second light emission control signal lines EM2 correspondingly connected to 6 rows of sub-pixels 11 in a one-to-one manner. A first light emission control signal line EM1 corresponding to each row of sub-pixels 11 is electrically connected to the third shift register 400 in the stage corresponding to the each row of sub-pixels 11. A second light emission control signal line EM2 corresponding to sub-pixels 11 in each of the 1st row to the (N−1)-th row is electrically connected to a third shift register 400 in the next stage. A second light emission control signal line EM2 corresponding to sub-pixels 11 in the N-th row is electrically connected to a third shift register 400 in the 1st stage.

During one frame, the third shift register 400 in the 1st stage outputs a first light emission control signal Emit1 to the 1st first light emission control signal line EM1. Thus, light emission control transistors M16 of pixel driving circuits 111 in the sub-pixels 11 in the 1st row are turned on. Then, under the drive of the first light emission control signal Emit1 (that is, a shift control signal) output from the third shift register 400 in the 1st stage, a third shift register 400 in the 2nd stage outputs the first light emission control signal Emit1 to the 2nd first light emission control signal line EM1. Thus, light emission control transistors M16 of pixel driving circuits 111 in sub-pixels 11 in the 2nd row are turned on. Meanwhile, the first light emission control signal Emit1 output from the third shift register 400 in the 2nd stage also serves as a second light emission control signal Emit2 transmitted by the 1st second light emission control signal line EM2. That is, the third shift register 400 in the 2nd stage outputs the second light emission control signal Emit2 to the 1st second light emission control signal line EM2 while outputting the first light emission control signal Emit1 to the 2nd first light emission control signal line EM1. Thus, the cathode switch transistor M0 correspondingly connected to the sub-pixels 11 in the 1st row is turned on. By analogy, under the drive of a first light emission control signal Emit1 (that is, a shift control signal) output from a third shift register 400 in the (N−1)-th stage, the third shift register 400 in the N-th stage outputs the first light emission control signal Emit1 to the N-th first light emission control signal line EM1. Thus, light emission control transistors M16 of pixel driving circuits 111 in sub-pixels 11 in the N-th row are turned on. Meanwhile, the second light emission control signal Emit2 is output to the (N−1)-th second light emission control signal line EM2 so that the cathode switch transistor M0 correspondingly connected to sub-pixels 11 in the (N−1)-th row is turned on.

It is to be noted that the second light emission control signal line EM2 corresponding to the sub-pixels 11 in the N-th row is electrically connected to the third shift register 400 in the 1st stage. That is, the third shift register 400 in the 1st stage outputs the first light emission control signal Emit1 to the 1st first light emission control signal line EM1. Thus, the second light emission control signal Emit2 is output to the N-th second light emission control signal line EM2 while light emission control transistors M16 of pixel driving circuits 111 in the sub-pixels 11 in the 1st row are turned on. Thus, the cathode switch transistor M0 correspondingly connected to the sub-pixels 11 in the N-th row is turned on. In this manner, the row-by-row turn-on of light emission control transistors M16 in the N rows of sub-pixels 11 and the row-by-row turn-on of cathode switch transistors M0 correspondingly connected to the N rows of sub-pixels 11 can be implemented.

In this embodiment, when the delay time Δt corresponding to each row of sub-pixels 11 is equal, only one set of N cascaded third shift registers 400 is required to implement the output of the first light emission control signal Emit1 and output of the second light emission control signal Emit2. In this manner, the row-by-row turn-on of light emission control transistors M16 in the N rows of sub-pixels 11 and the row-by-row turn-on of cathode switch transistors M0 correspondingly connected to the N rows of sub-pixels 11 can be implemented through fewer shift registers, thereby further reducing the width of the bezel and facilitating the narrow bezel design of the display panel.

Figure 20:
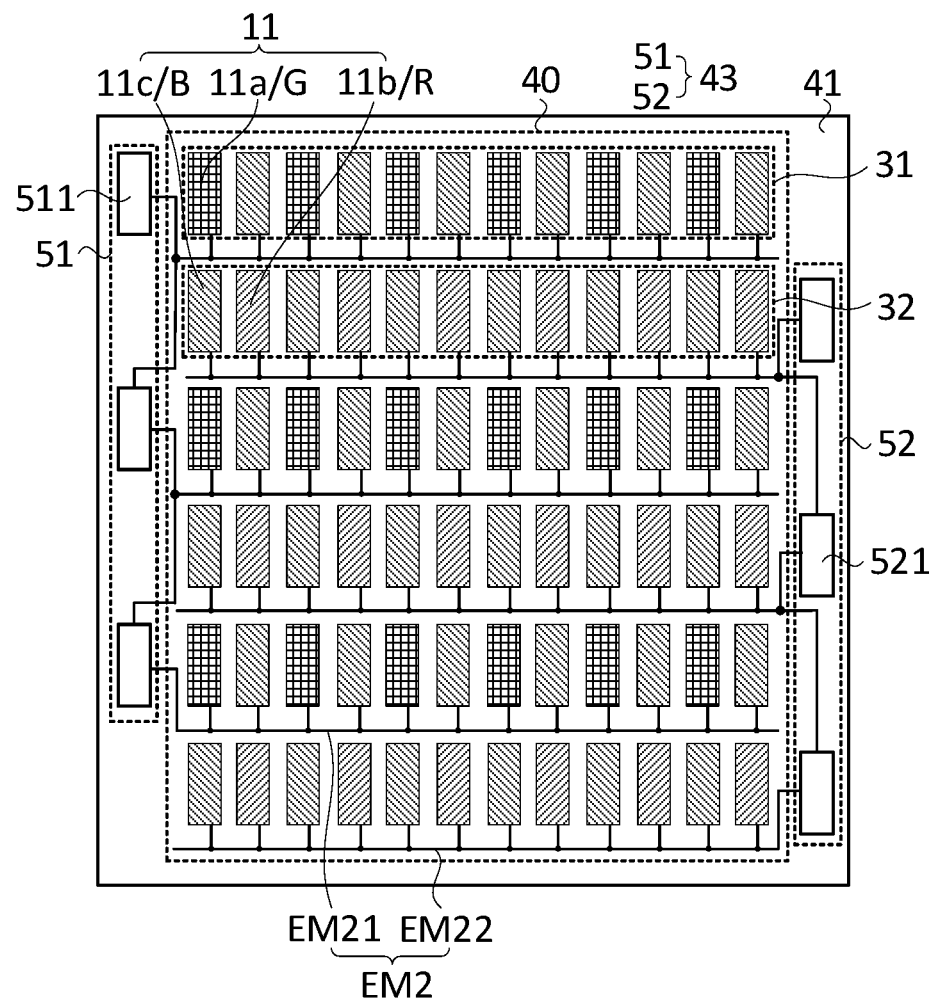
FIG. 20 is a diagram illustrating the structure of another display panel according to an embodiment of the present disclosure.

FIG. 20 is a diagram illustrating the structure of another display panel according to an embodiment of the present disclosure. As shown in FIG. 20, optionally, multiple sub-pixels 11 include first sub-pixel rows 31 and second sub-pixel rows 32. The maximum capacitance sub-pixel in a first sub-pixel row 31 and the maximum capacitance sub-pixel in a second sub-pixel row 32 have different emitted colors. The capacitance value of the pixel capacitor of the maximum capacitance sub-pixel in the first sub-pixel row 31 is greater than the capacitance value of the pixel capacitor of the maximum capacitance sub-pixel in the second sub-pixel row 32. The delay time Δt corresponding to the first sub-pixel row 31 is greater than the delay time Δt corresponding to the second sub-pixel row 32. A second light emission control signal line EM2 includes a first light emission control signal sub-line EM21 and a second light emission control signal sub-line EM22. The gate of the cathode switch transistor M0 corresponding to the first sub-pixel row 31 is electrically connected to the first light emission control signal sub-line EM21. The gate of the cathode switch transistor M0 corresponding to the second sub-pixel row 32 is electrically connected to the second light emission control signal sub-line EM22. A second scan driving circuit 43 includes a first scan sub-circuit 51 and a second scan sub-circuit 52. The first scan sub-circuit 51 is electrically connected to the first light emission control signal sub-line EM21. The second scan sub-circuit 52 is electrically connected to the second light emission control signal sub-line EM22.

In one row of sub-pixels 11, a sub-pixel 11 with the maximum capacitance value of the pixel capacitor of a light-emitting element 112 is the maximum capacitance sub-pixel in the one row of sub-pixels 11.

As described above, when the maximum capacitance sub-pixel in the first sub-pixel row 31 and the maximum capacitance sub-pixel in the second sub-pixel row 32 have emitted colors, and the capacitance value of the pixel capacitor of the maximum capacitance sub-pixel in the first sub-pixel row 31 is greater than the capacitance value of the pixel capacitor of the maximum capacitance sub-pixel in the second sub-pixel row 32, the delay time Δt corresponding to the first sub-pixel row 31 may be set to be greater than the delay time Δt corresponding to the second sub-pixel row 32. Thus, the light-emitting duration of light-emitting elements 112 of sub-pixels 11 in the second sub-pixel row 32 in a light emission stage T3 can be greater than the light-emitting duration of light-emitting elements 112 of sub-pixels 11 in the first sub-pixel row 31 in the light emission stage T3 while it is ensured that the first sub-pixel row 31 completes the charging processes of pixel capacitors of light-emitting elements 112 in the first sub-pixel row 31 in a first light-emitting sub-stage T31, thereby improving the luminescence efficiency of sub-pixels 11 in the second sub-pixel row 32. Moreover, a smaller working current density can be adopted under the condition of implementing the same brightness, which is helpful to prolong the service life of sub-pixels 11 in the second sub-pixel row 32.

With continued reference to FIG. 20, when the delay time Δt corresponding to the first sub-pixel row 31 is different from the delay time Δt corresponding to the second sub-pixel row 32, the second scan driving circuit 43 is set to include two scan sub-circuits, a first scan sub-circuit 51 and a second scan sub-circuit 52, respectively. The first scan sub-circuit 51 is electrically connected to the gate of the cathode switch transistor M0 corresponding to the first sub-pixel row 31 by the first light emission control signal sub-line EM21, so that the first scan sub-circuit 51 sequentially provides a second light emission control signal Emit2 for first sub-pixel rows 31, thereby controlling cathode switch transistors M0 corresponding to the first sub-pixel rows 31 to be turned on. The second scan sub-circuit 52 is electrically connected to the gate of the cathode switch transistor M0 corresponding to the second sub-pixel row 32 by the second light emission control signal sub-line EM22, so that the second scan sub-circuit 52 sequentially provides a second light emission control signal Emit2 for second sub-pixel rows 32, thereby controlling cathode switch transistors M0 corresponding to the second sub-pixel rows 32 to be turned on.

The second light emission control signal Emit2 received by the cathode switch transistor M0 corresponding to the first sub-pixel row 31 and the second light emission control signal Emit2 received by the cathode switch transistor M0 corresponding to the second sub-pixel row 32 are provided by two independent scan sub-circuits (for example, the first scan sub-circuit 51 and the second scan sub-circuit 52 in FIG. 20) in a one-to-one manner. The turn-on time of the cathode switch transistor M0 corresponding to the first sub-pixel row 31 and the turn-on time of the cathode switch transistor M0 corresponding to the second sub-pixel row 32 can be independently controlled through two different scan sub-circuits in a one-to-one manner. Thus, the delay time Δt corresponding to the first sub-pixel row 31 and the delay time Δt corresponding to the second sub-pixel row 32 can be flexibly adjusted according to different pixel arrangements so that the delay time Δt of the first sub-pixel row 31 and the delay time Δt of the second sub-pixel row 32 are different.

With continued reference to FIG. 20, exemplarily, the first scan sub-circuit 51 may include multiple cascaded fourth shift registers 511. The number of the fourth shift registers 511 is the same as the number of the first sub-pixel rows 31. The multiple fourth shift registers 511 are electrically connected to multiple first light emission control signal sub-lines EM21 correspondingly connected to multiple rows of first sub-pixels 31 in a one-to-one manner. The second scan sub-circuit 52 may include multiple cascaded fifth shift registers 521. The number of the fifth shift registers 521 is the same as the number of the second sub-pixel rows 32. The multiple fifth shift registers 521 are electrically connected to multiple second light emission control signal sub-lines EM22 correspondingly connected to multiple rows of second sub-pixels 32 in a one-to-one manner.

As shown in FIG. 20, that first sub-pixel rows 31 and second sub-pixel rows 32 are alternately arranged along the column direction is taken as an example for illustration. During one frame, a fourth shift register 511 in the 1st stage outputs a second light emission control signal Emit2 to the 1st first light emission control signal sub-line EM21. Thus, a cathode switch transistor M0 correspondingly connected to a first sub-pixel row 31 in the 1st row is turned on.

Then, a fifth shift register 521 in the 1st stage outputs a second light emission control signal Emit2 to the 1st second light emission control signal sub-line EM22. Thus, a cathode switch transistor M0 correspondingly connected to a second sub-pixel row 32 in the 1st row is turned on.

Then, under the drive of the second light emission control signal Emit2 (that is, a shift control signal) output from the fourth shift register 511 in the 1st stage, a fourth shift register 511 in the 2nd stage outputs the second light emission control signal Emit2 to a second first light emission control signal sub-line EM21. Thus, a cathode switch transistor M0 correspondingly connected to a first sub-pixel row 31 in the 2nd row is turned on.

Then, under the drive of the second light emission control signal Emit2 (that is, a shift control signal) output from the fifth shift register 521 in the 1st stage, a fifth shift register 521 in the 2nd stage outputs the second light emission control signal Emit2 to the 2nd second light emission control signal sub-line EM22. Thus, a cathode switch transistor M0 correspondingly connected to a second sub-pixel row 32 in the 2nd row is turned on.

By analogy, the row-by-row turn-on of cathode switch transistors M0 correspondingly connected to first sub-pixel rows 31 and second sub-pixel rows 32 is implemented.

Figure 21:
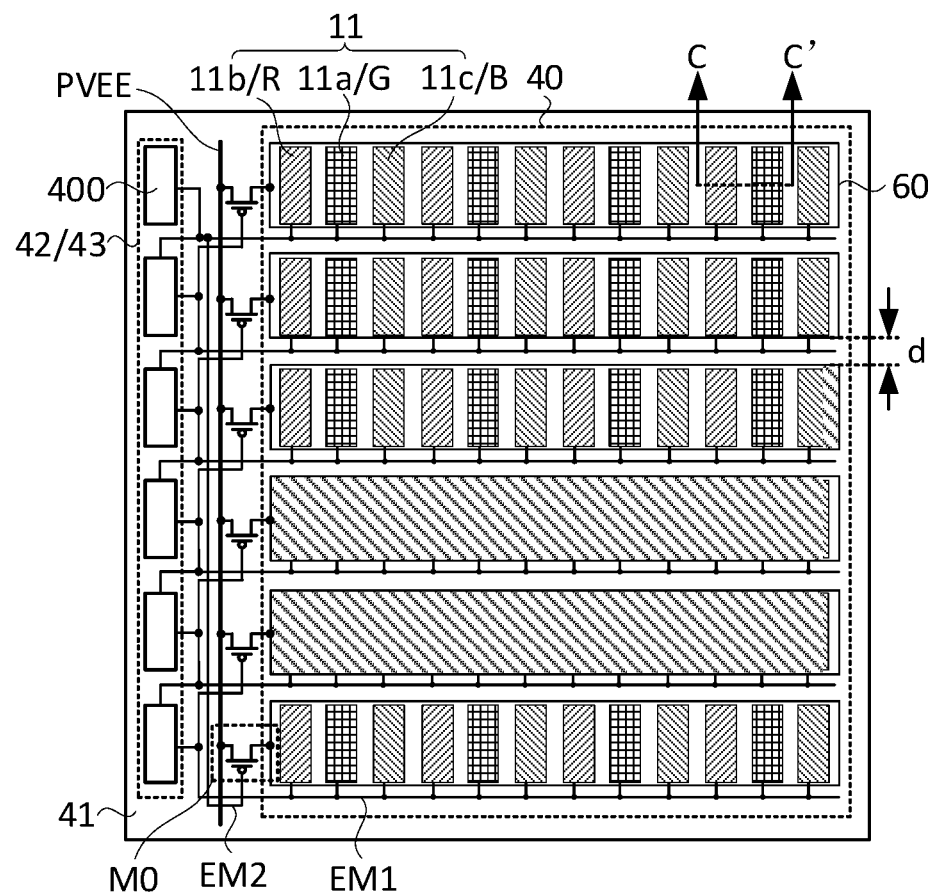
FIG. 21 is a diagram illustrating the structure of another display panel according to an embodiment of the present disclosure.
Figure 22:
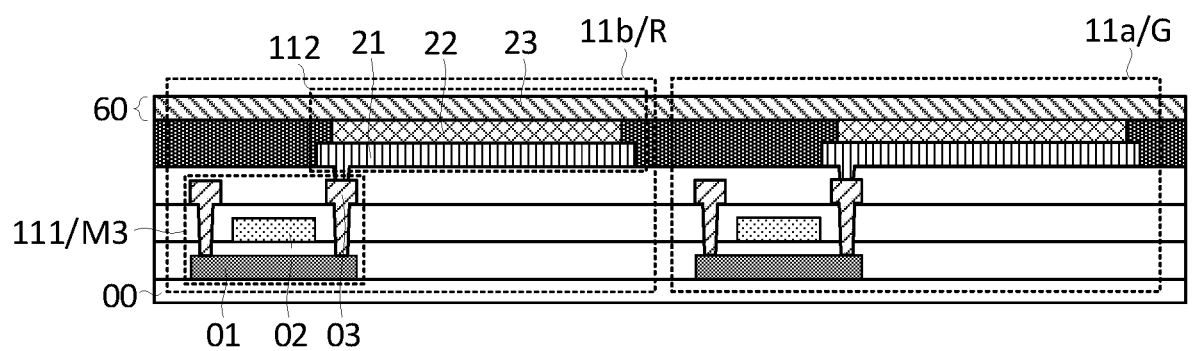
FIG. 22 is a sectional structure diagram of FIG. 21 taken along direction C-C'.

FIG. 21 is a diagram illustrating the structure of another display panel according to an embodiment of the present disclosure. FIG. 22 is a sectional structure diagram of FIG. 21 taken along direction C-C'. As shown in FIG. 21 and FIG.

22, optionally, cathodes 23 of light-emitting elements 112 in the same row of sub-pixels 11 are connected in series to form a cathode row 60. Cathode rows 60 in different rows of sub-pixels 11 are insulated from each other. The cathode row 60 is electrically connected to a second power signal line PVEE by a cathode switch transistor M0 corresponding to the cathode row 60.

As described above, driving processes of pixel driving circuits 111 of the same row of sub-pixels 11 are performed simultaneously. That is, initialization stages T1, data signal voltage write stages T2, and light emission stages T3 (including first light-emitting sub-stages T31 and second light-emitting sub-stages T32) of the same row of sub-pixels 11 are performed simultaneously.

As shown in FIG. 21 and FIG. 22, in this embodiment, cathodes 23 of light-emitting elements 112 of the same row of sub-pixels 11 are set to be connected in series to form a cathode row 60. Each row of sub-pixels 11 is correspondingly provided with one cathode row 60. A cathode row 60 covers light-emitting layers 22 of light-emitting elements 112 of all sub-pixels 11 in the row along the thickness direction of the display panel.

Multiple cathode rows 60 extend along the row direction and are arranged along the column direction. A gap exists between two adjacent cathode rows 60 along the column direction. Thus, the two adjacent cathode rows 60 are insulated.

With continued reference to FIG. 21 and FIG. 22, each cathode row 60 is electrically connected to the second power signal line PVEE by a corresponding cathode switch transistor M0. When a cathode switch transistor M0 corresponding to a row of sub-pixels 11 is turned on, the cathode row 60 corresponding to the row of sub-pixels 11 and the second power signal line PVEE are turned on. Since cathodes 23 of all light-emitting elements 112 in the row of sub-pixels 11 are connected in series to form the cathode row 60, the turn-on between the cathode row 60 and the second power signal line PVEE is equivalent to the turn-on between the cathodes 23 of all light-emitting elements 112 in the row of sub-pixels 11 and the second power signal line PVEE. In this manner, at least two sub-pixels 11 of a row of sub-pixels 11 can share one cathode switch transistor M0, so that the turn-on and turn-off between cathodes 23 of light-emitting elements 112 in the row of sub-pixels 11 and the second power signal line PVEE can be controlled through a smaller number of cathode switch transistors M0, which is helpful to reduce the occupation space of cathode switch transistors M0 and reduce the cost.

With continued reference to FIG. 21 and FIG. 22, optionally, one end of a cathode row is electrically connected to the second power signal line PVEE by one cathode switch transistor M0. In this manner, each row of sub-pixels 11 needs only one cathode switch transistor M0 to control the turn-on and turn-off between cathodes 23 of light-emitting elements 112 in the each row of sub-pixels 11 and the second power signal line PVEE, which is helpful to reduce the occupation space of cathode switch transistors M0 and reduce the cost.

Figure 23:
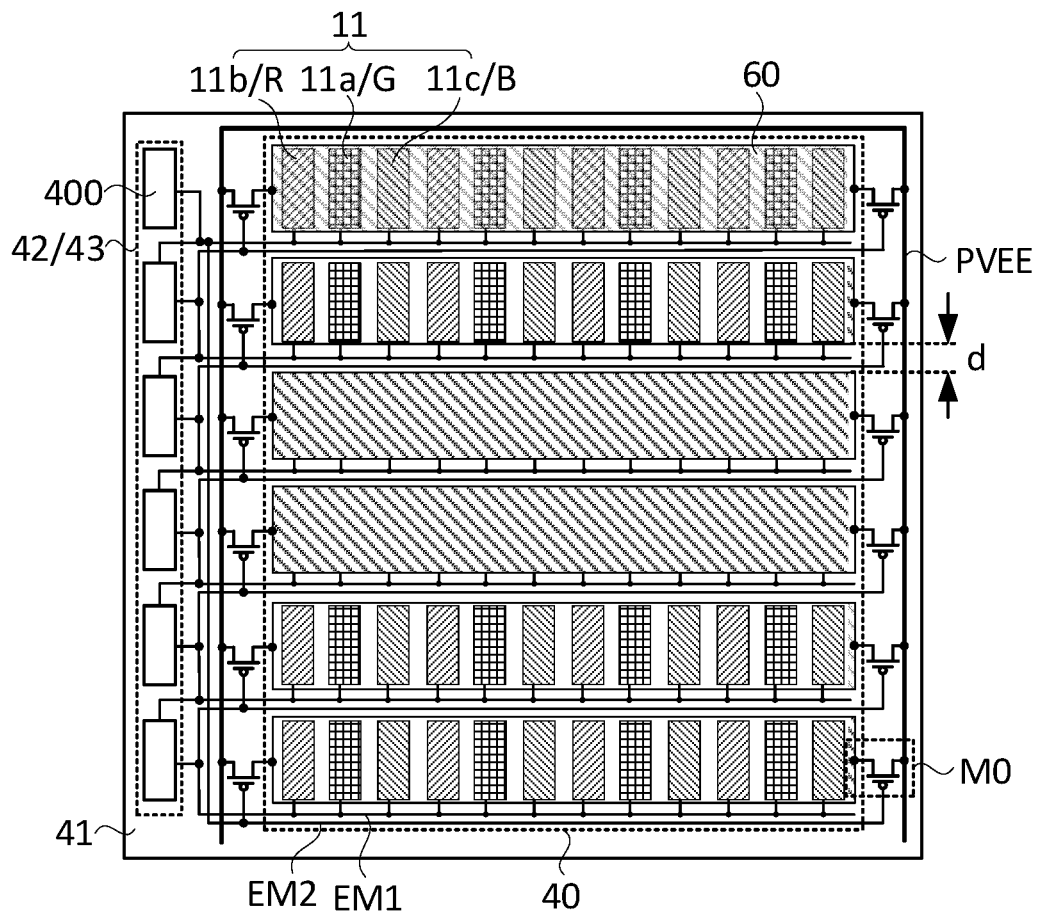
FIG. 23 is a diagram illustrating the structure of another display panel according to an embodiment of the present disclosure.

FIG. 23 is a diagram illustrating the structure of another display panel according to an embodiment of the present disclosure. As shown in FIG. 23, optionally, one cathode switch transistor M0 is connected between each of two ends of a cathode row 60 and a second power signal line PVEE, respectively. In this manner, when cathode switch transistors M0 are turned on, the turn-on between each of the two ends of the cathode row 60 and the second power signal line PVEE is achieved. Thus, the transmission efficiency of a second power voltage transmitted from the second power signal line PVEE to the cathode row 60 can be improved so that the second power voltage on the second power signal line PVEE can be rapidly transmitted to a light-emitting element 112 at each position in the same row of sub-pixels 11, thereby helping to make the light-emitting start time of light-emitting elements 112 in the same row of sub-pixels 11 more consistent in a light emission stage T3.

With continued reference to FIG. 21 and FIG. 23, optionally, the shortest distance between adjacent cathode rows 60 is d, where d≥2.5 μm. By setting a gap greater than or equal to 2.5 μm between adjacent cathode rows 60, the preparation process is easily implemented while the insulation between adjacent cathode rows 60 is ensured.

With continued reference to FIG. 21 and FIG. 23, optionally, cathode switch transistors M0 are disposed in a non-display region 41 to prevent the cathode switch transistors M0 from affecting the image display of a display region 40.

Figure 24:
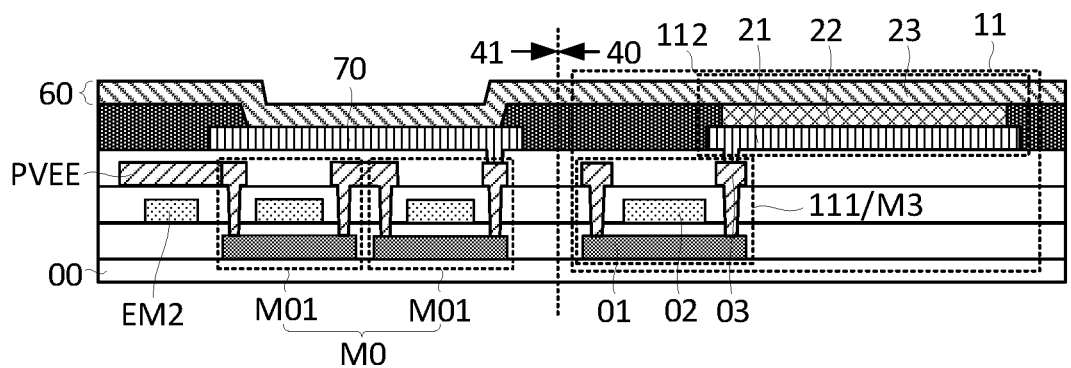
FIG. 24 is a partial sectional structure diagram of a display panel according to an embodiment of the present disclosure.
Figure 25:
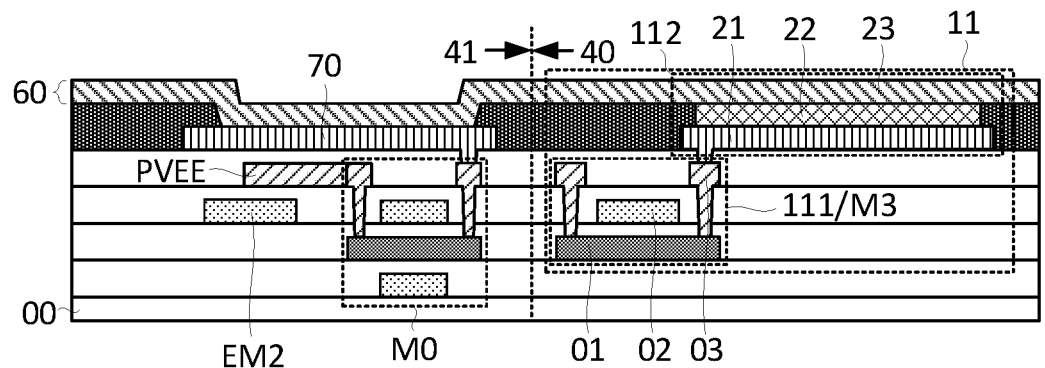
FIG. 25 is a partial sectional structure diagram of another display panel according to an embodiment of the present disclosure.

FIG. 24 is a partial sectional structure diagram of a display panel according to an embodiment of the present disclosure. FIG. 25 is a partial sectional structure diagram of another display panel according to an embodiment of the present disclosure. As shown in FIG. 24 and FIG. 25, optionally, a cathode switch transistor M0 includes at least two sub-switch transistors M01. The at least two sub-switch transistors M01 are connected in series, and/or the cathode switch transistor M0 includes a double-gate transistor.

As shown in FIG. 24, a cathode switch transistor M0 is formed by connecting at least two sub-switch transistors M01 in series. When the cathode switch transistor M0 is cut off under the action of the second light emission control signal Emit2 of the second light emission control signal line EM2, all of the at least two sub-switch transistors M01 are cut off. In this manner, the leakage current of the cathode switch transistor M0 at cutoff can be smaller, thereby avoiding the problem of emitting undesired light by a light-emitting element 112 in a non-light emission stage caused by the leakage current between a cathode 23 and the second power signal line PVEE.

In other embodiments, as shown in FIG. 25, by setting a cathode switch transistor M0 as a double-gate transistor, the leakage current of the cathode switch transistor M0 at cutoff can be reduced, thereby avoiding the problem of emitting undesired light by a light-emitting element 112 in a non-light emission stage caused by the leakage current between a cathode 23 and the second power signal line PVEE.

With continued reference to FIG. 24 and FIG. 25, optionally, the gate of the cathode switch transistor M0 is located on the same film layer as the second light emission control signal line EM2.

The gate of the cathode switch transistor M0 needs to be electrically connected to the second light emission control signal line EM2. By disposing the gate of the cathode switch transistor M0 and the second light emission control signal line EM2 in the same layer, the gate of the cathode switch transistor M0 can be directly connected to the second light emission control signal line EM2 in the same film layer without performing punching, thereby helping to reduce technique difficulty.

Moreover, by disposing the gate of the cathode switch transistor M0 and the second light emission control signal line EM2 in the same layer, the arrangement of one metal layer can be reduced, thereby achieving the purpose of reducing the production cost and the thickness of the substrate. The gate of the cathode switch transistor M0 may be made of the same material as the second light emission control signal line EM2. Thus, the gate of the cathode switch transistor M0 and the second light emission control signal line EM2 can be prepared in the same process, thereby shortening the process time.

With continued reference to FIG. 24, optionally, the display panel further includes a base substrate 00. The cathode switch transistor M0 and a drive transistor M3 are located on the same side of the base substrate 00. The active layer of the cathode switch transistor M0 and the active layer 01 of the drive transistor M3 are located on the same film layer. The gate layer of the cathode switch transistor M0 and the gate layer 02 of the drive transistor M3 are located on the same film layer. The source and drain electrode layer of the cathode switch transistor M0 and the source and drain electrode layer 03 of the drive transistor M3 are located on the same film layer.

Specifically, as shown in FIGS. 2, 22, 24, and 25, the drive transistor M3 can include the active layer 01, the gate layer 02, and the source and drain electrode layer 03 which are stacked on the base substrate 00.

As shown in FIG. 24, in this embodiment, by disposing the cathode switch transistor M0 and the drive transistor M3 in the same layer, the number of film layers is reduced, thereby achieving the purpose of reducing the production cost and the thickness of the substrate. Moreover, the cathode switch transistor M0 and the drive transistor M3 can be prepared in the same process, thereby shortening the process time.

With continued reference to FIG. 24 and FIG. 25, optionally, the display panel also includes the base substrate 00. The cathode switch transistor M0 and the second power signal line PVEE are located on the same side of the base substrate 00. The source and drain electrode layer of the cathode switch transistor M0 and the second power signal line PVEE are located on the same film layer.

The source and drain electrode layer of the cathode switch transistor M0 needs to be electrically connected to the second power signal line PVEE, so that the source and drain electrode layer of the cathode switch transistor M0 and the second power signal line PVEE are disposed in the same layer, and thus, the source and drain electrode layer of the cathode switch transistor M0 can be directly connected to the second power signal line PVEE in the same film layer without performing punching, thereby helping to reduce technique difficulty.

Moreover, by disposing the source and drain electrode layer of the cathode switch transistor M0 and the second power signal line PVEE in the same layer, the arrangement of a metal layer can be reduced, thereby achieving the purpose of reducing the production cost and the thickness of the substrate. The source and drain electrode layer of the cathode switch transistor M0 may be made of the same material as the second power signal line PVEE. Thus, the source and drain electrode layer of the cathode switch transistor M0 and the second power signal line PVEE can be prepared in the same process, thereby shortening the process time.

With continued reference to FIG. 24 and FIG. 25, optionally, the display panel further includes the base substrate 00. The cathode switch transistor M0 and the light-emitting element 112 are located on the same side of the base substrate 00. The light-emitting element 112 is located on the side of the cathode switch transistor M0 facing away from the base substrate 00. The cathode 23 of the light-emitting element 112 is located on the side of the anode 21 of the light-emitting element 112 facing away from the base substrate 00. The source and drain electrode layer of the cathode switch transistor M0 is electrically connected to the cathode 23 of the light-emitting element 112 by a bridge metal layer 70. The bridge metal layer 70 is located between the source and drain electrode layer of the cathode switch transistor M0 and the cathode 23 of the light-emitting element 112.

The source and drain electrode layer of the cathode switch transistor M0 is electrically connected to the cathode 23 of the light-emitting element 112 by the bridge metal layer 70 located between the source and drain electrode layer of the cathode switch transistor M0 and the cathode 23 of the light-emitting element 112. Thus, a deep punching process can be avoided when the source and drain electrode layer of the cathode switch transistor M0 is electrically connected to the cathode 23 of the light-emitting element 112, thereby ensuring a simple electrical connection process between the source and drain electrode layer of the cathode switch transistor M0 and the cathode 23 of the light-emitting element 112.

With continued reference to FIG. 24 and FIG. 25, optionally, the bridge metal layer 70 and the anode 21 are located in the same film layer.

By disposing the bridge metal layer 70 and the anode 21 in the same layer, the arrangement of one metal layer can be reduced, thereby achieving the purpose of reducing the production cost and the thickness of the substrate. Moreover, the bridge metal layer 70 may be made of the same material as the anode 21. Thus, the bridge metal layer 70 and the anode 21 can be prepared in the same process, thereby shortening the process time.

Figure 26:
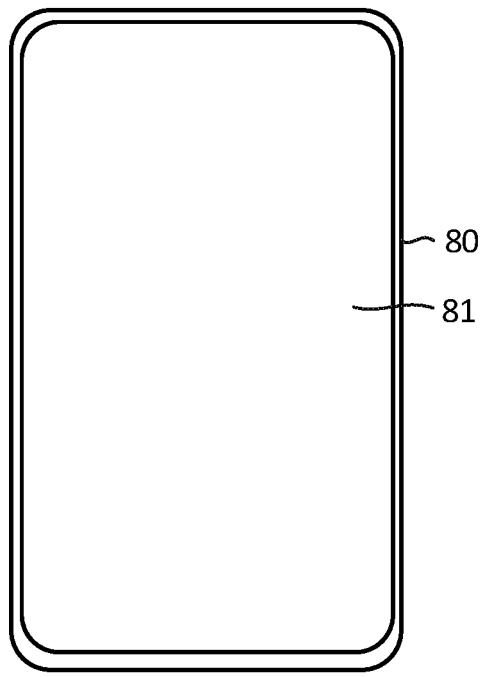
FIG. 26 is a diagram illustrating the structure of a display device according to an embodiment of the present disclosure.

Based on the same inventive concept, the embodiments of the present disclosure further provide a display device. FIG. 26 is a diagram illustrating the structure of a display device according to an embodiment of the present disclosure. As shown in FIG. 26, a display device 80 includes a display panel 81 according to any embodiment of the present disclosure. Therefore, the display device 80 provided in the embodiments of the present disclosure has the technical effects of the technical solution of any one of the preceding embodiments. Explanations of structures and terms the same as or corresponding to structures and terms in the preceding embodiments are not repeated here.

The display device 80 provided in the embodiments of the present disclosure may be the phone shown in FIG. 26, or may be any electronic product with display function, including but not limited to a television, a laptop, a desktop display, a tablet computer, a digital camera, a smart bracelet, a smart glass, a vehicle-mounted display, medical equipment, industrial control equipment, and a touch interactive terminal. No special limitations are made thereto in the embodiments of the present disclosure.

Based on the same inventive concept, the embodiments of the present disclosure also provide a driving method of a display panel. The driving method can be applied to driving any display device provided in the preceding embodiments. Explanations of structures and terms the same as or corresponding to structures and terms in the preceding embodiments are not repeated here.

The display panel includes a cathode switch transistor and multiple sub-pixels arranged in an array. A sub-pixel includes a pixel driving circuit and a light-emitting element electrically connected to the pixel driving circuit. The pixel driving circuit includes a drive transistor and at least one light emission control transistor. The drive transistor, the light emission control transistor, the light-emitting element, and the cathode switch transistor are connected in series between a first power signal line and a second power signal line. The light emission control transistor is connected in series between the anode of the light-emitting element and the first power signal line. The cathode switch transistor is connected in series between the cathode of the light-emitting element and the second power signal line. The gate of the light emission control transistor is electrically connected to a first light emission control signal line. The gate of the cathode switch transistor is electrically connected to a second light emission control signal line.

For the description of structures and explanations of terms of the preceding display panel, reference can be made to the preceding embodiments. The details are not repeated here.

Figure 27:
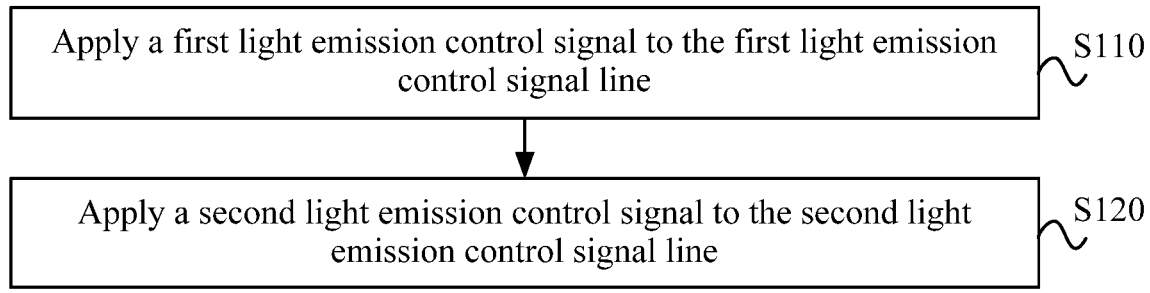
FIG. 27 is a flowchart of a driving method of a display panel according to an embodiment of the present disclosure.

FIG. 27 is a flowchart of a driving method of a display panel according to an embodiment of the present disclosure. As shown in FIG. 27, the driving method includes the following steps.

In S110, a first light emission control signal is applied to the first light emission control signal line.

In S120, a second light emission control signal is applied to the second light emission control signal line.

In at least one light emission stage, the start time of an effective pulse of the second light emission control signal lags behind the start time of an effective pulse of the first light emission control signal.

According to the driving method of the display panel provided in the embodiments of the present disclosure, the first light emission control signal is applied to the first light emission control signal line in the light emission stage so that light emission control transistors are first turned on, and pixel capacitors of light-emitting elements are charged. After the charging of pixel capacitors of light-emitting elements emitting light of different colors is completed, the second light emission control signal is applied to the second light emission control signal line so that the cathode switch transistor is turned on. Thus, the light-emitting elements emitting light of different colors emit light simultaneously when the cathode switch transistor is turned on so that the light-emitting duration and luminescence efficiency of the light-emitting elements emitting light of different colors tend to be consistent in the light emission stage, thereby solving the color cast problem caused by the difference in the pixel capacitors of the light-emitting elements emitting light of different colors.

Optionally, at least part of sub-pixels have different emitted colors. Light-emitting elements in the sub-pixels have corresponding pixel capacitors. Capacitance values of pixel capacitors of light-emitting elements in sub-pixels of different emitted colors are different. In at least one row of sub-pixels, a sub-pixel with the maximum capacitance value of the pixel capacitor of a light-emitting element is the maximum capacitance sub-pixel. The charging time of the pixel capacitor of the light-emitting element in the maximum capacitance sub-pixel is t1. For at least one row of sub-pixels, in the light emission stage, a duration in which the start time of the effective pulse of the second light emission control signal of the second light emission control signal line corresponding to the sub-pixels lags behind the start time of the effective pulse of the first light emission control signal of the first light emission control signal line corresponding to the sub-pixels is delay time. The delay time is $\Delta t$, and $\Delta t \geq t1$.

For the description of structures and explanations of terms of the preceding display panel, reference can be made to the preceding embodiments. The details are not repeated here.

In this embodiment, for any row of sub-pixels, the delay time $\Delta t$ is set to be greater than or equal to the charging time t1 of the pixel capacitor of the light-emitting element in the maximum capacitance sub-pixel, so that for any row of sub-pixels, the charging processes of pixel capacitors of light-emitting elements of all sub-pixels in this row can be completed before cathode switch transistor is turned on, thereby ensuring that each row of sub-pixels emits light simultaneously when the cathode switch transistor correspondingly connected to the each row of sub-pixels is turned on (that is, at the start time of the effective pulse of the second light emission control signal of the second light emission control signal line) without charging the pixel capacitors of the light-emitting elements again. Thus, the light-emitting start time of light-emitting elements emitting light of different colors in the same row of sub-pixels is consistent in the light emission stage, and the light-emitting duration of the light-emitting elements emitting light of different colors tends to be consistent in the light emission stage. Moreover, the luminescence efficiency of the light-emitting elements tends to be consistent, thereby solving the color cast problem caused by the difference in the pixel capacitors of the light-emitting elements emitting light of different colors.

It is to be understood that various forms of processes shown above may be adopted with steps reordered, added, or deleted. For example, the steps described in the present disclosure may be performed in parallel, sequentially, or in different orders, as long as the desired results of the technical solutions of the present disclosure can be implemented, and no limitation is imposed herein.

The preceding specific embodiments do not constitute a limitation on the protection scope of the present disclosure. It is to be understood by those skilled in the art that various modifications, combinations, sub-combinations, and substitutions may be performed according to design requirements and other factors. Any modifications, equivalent replacements, improvements, and the like within the spirit and principle of the present disclosure shall fall within the protection scope of the present disclosure.

What is claimed is:

1. A display panel, comprising:
   a cathode switch transistor and a plurality of sub-pixels arranged in an array, wherein
   a sub-pixel of the plurality of sub-pixels comprises a pixel driving circuit and a light-emitting element electrically connected to the pixel driving circuit, wherein the pixel driving circuit comprises a drive transistor and at least one light emission control transistor;
   the drive transistor, the at least one light emission control transistor, the light-emitting element, and the cathode switch transistor are connected in series between a first power signal line and a second power signal line, wherein the at least one light emission control transistor is connected in series between an anode of the light-emitting element and the first power signal line, and the cathode switch transistor is connected in series between a cathode of the light-emitting element and the second power signal line; and
   a gate of a light emission control transistor of the at least one light emission control transistor is electrically connected to a first light emission control signal line, a gate of the cathode switch transistor is electrically connected to a second light emission control signal line, and in at least one light emission stage, start time of an effective pulse of a second light emission control signal of the second light emission control signal line lags behind start time of an effective pulse of a first light emission control signal of the first light emission control signal line; and
   wherein at least part of the plurality of sub-pixels have different emitted colors, a light-emitting element of light-emitting elements in the plurality of sub-pixels has a pixel capacitor corresponding to the light-emitting element, and capacitance values of pixel capacitors of light-emitting elements in sub-pixels of different emitted colors are different;

in at least one row of sub-pixels of the plurality of sub-pixels, a sub-pixel with a maximum capacitance value of a pixel capacitor of a light-emitting element is a maximum capacitance sub-pixel, and charging time of the pixel capacitor of the light-emitting element in the maximum capacitance sub-pixel is t1; and for at least one row of sub-pixels of the plurality of sub-pixels, in the at least one light emission stage, a duration in which start time of an effective pulse of a second light emission control signal of a second light emission control signal line corresponding to the at least one row of sub-pixels lags behind start time of an effective pulse of a first light emission control signal of a first light emission control signal line corresponding to the at least one row of sub-pixels is delay time, wherein the delay time is Δt, and Δt≥t1.

2. The display panel according to claim 1, wherein the plurality of sub-pixels comprise a first color sub-pixel, a second color sub-pixel, and a third color sub-pixel, wherein a capacitance value of a pixel capacitor of a light-emitting element in the first color sub-pixel is greater than a capacitance value of a pixel capacitor of a light-emitting element in the second color sub-pixel, and the capacitance value of the pixel capacitor of the light-emitting element in the second color sub-pixel is greater than a capacitance value of a pixel capacitor of a light-emitting element in the third color sub-pixel;

charging time of the pixel capacitor of the light-emitting element in the first color sub-pixel is t2, wherein Δt≥t2.

3. The display panel according to claim 2, wherein delay time corresponding to each row of sub-pixels of the plurality of sub-pixels is equal.

4. The display panel according to claim 1, wherein 2 μs≤Δt≤4 μs.

5. The display panel according to claim 1, wherein the plurality of sub-pixels comprise first sub-pixel rows and second sub-pixel rows, wherein an emitted color of a maximum capacitance sub-pixel in a first sub-pixel row of the first sub-pixel rows and an emitted color of a maximum capacitance sub-pixel in a second sub-pixel row of the second sub-pixel rows are different, and a capacitance value of a pixel capacitor of the maximum capacitance sub-pixel in the first sub-pixel row is greater than a capacitance value of a pixel capacitor of the maximum capacitance sub-pixel in the second sub-pixel row; and delay time corresponding to the first sub-pixel row is greater than delay time corresponding to the second sub-pixel row.

6. The display panel according to claim 5, wherein the first sub-pixel rows and the second sub-pixel rows are alternately arranged along a column direction;

the plurality of sub-pixels comprise first color sub-pixels, second color sub-pixels, and third color sub-pixels, wherein a capacitance value of a pixel capacitor of a light-emitting element in a first color sub-pixel of the first color sub-pixels is greater than a capacitance value of a pixel capacitor of a light-emitting element in a second color sub-pixel of the second color sub-pixels, and the capacitance value of the pixel capacitor of the light-emitting element in the second color sub-pixel is greater than a capacitance value of a pixel capacitor of a light-emitting element in a third color sub-pixel of the third color sub-pixels;

the first sub-pixel row comprises a first color sub-pixel and a second color sub-pixel, and the second sub-pixel row comprises a second color sub-pixel and a third color sub-pixel; or, the first sub-pixel row comprises a first color sub-pixel and a third color sub-pixel, and the second sub-pixel row comprises a second color sub-pixel and a third color sub-pixel; and the delay time corresponding to the first sub-pixel row is greater than or equal to charging time of a pixel capacitor of a light-emitting element in the first color sub-pixel in the first sub-pixel row, and the delay time corresponding to the second sub-pixel row is greater than or equal to charging time of a pixel capacitor of a light-emitting element in the second color sub-pixel in the second sub-pixel row.

7. The display panel according to claim 5, wherein the first sub-pixel rows and the second sub-pixel rows are alternately arranged along a column direction;

the plurality of sub-pixels comprise first color sub-pixels, second color sub-pixels, and third color sub-pixels, wherein a capacitance value of a pixel capacitor of a light-emitting element in a first color sub-pixel of the first color sub-pixels is greater than a capacitance value of a pixel capacitor of a light-emitting element in a second color sub-pixel of the second color sub-pixels, and the capacitance value of the pixel capacitor of the light-emitting element in the second color sub-pixel is greater than a capacitance value of a pixel capacitor of a light-emitting element in a third color sub-pixel of the third color sub-pixels; and the first sub-pixel row comprises a first color sub-pixel and a second color sub-pixel, and the second sub-pixel row comprises a third color sub-pixel; and the delay time corresponding to the first sub-pixel row is greater than or equal to charging time of a pixel capacitor of a light-emitting element in the first color sub-pixel in the first sub-pixel row, and the delay time corresponding to the second sub-pixel row is greater than or equal to charging time of a pixel capacitor of a light-emitting element in the third color sub-pixel in the second sub-pixel row;

or, the first sub-pixel row comprises a first color sub-pixel and a third color sub-pixel, and the second sub-pixel row comprises a second color sub-pixel; and the delay time corresponding to the first sub-pixel row is greater than or equal to charging time of a pixel capacitor of a light-emitting element in the first color sub-pixel in the first sub-pixel row, and the delay time corresponding to the second sub-pixel row is greater than or equal to charging time of a pixel capacitor of a light-emitting element in the second color sub-pixel in the second sub-pixel row;

or, the first sub-pixel row comprises a first color sub-pixel, and the second sub-pixel row comprises a second color sub-pixel and a third color sub-pixel; and the delay time corresponding to the first sub-pixel row is greater than or equal to charging time of a pixel capacitor of a light-emitting element in the first color sub-pixel in the first sub-pixel row, and the delay time corresponding to the second sub-pixel row is greater than or equal to charging time of a pixel capacitor of a light-emitting element in the second color sub-pixel in the second sub-pixel row.

8. The display panel according to claim 2, wherein the first color sub-pixel is a green sub-pixel, the second color sub-pixel is a red sub-pixel, and the third color sub-pixel is a blue sub-pixel.

9. The display panel according to claim 6, wherein the first color sub-pixel is a green sub-pixel, the second color sub-pixel is a red sub-pixel, and the third color sub-pixel is a blue sub-pixel.

10. The display panel according to claim 1, wherein
the display panel further comprises a display region and a non-display region located on at least one side of the display region, and the non-display region comprises a first scan driving circuit and a second scan driving circuit; and
the first light emission control signal line is electrically connected to the first scan driving circuit, and the second light emission control signal line is electrically connected to the second scan driving circuit.

11. The display panel according to claim 2, wherein
the display panel further comprises a display region and a non-display region located on at least one side of the display region, and the non-display region comprises a first scan driving circuit and a second scan driving circuit; and
the first light emission control signal line is electrically connected to the first scan driving circuit, and the second light emission control signal line is electrically connected to the second scan driving circuit.

12. The display panel according to claim 10, wherein
delay time corresponding to each row of sub-pixels of the plurality of sub-pixels is equal;
N rows of sub-pixels are provided in the display panel;
the first scan driving circuit comprises N cascaded first shift registers, and the second scan driving circuit comprises N cascaded second shift registers;
a first light emission control signal line corresponding to sub-pixels in an i-th row among the N rows of sub-pixels is electrically connected to a first shift register in an i-th stage among the N cascaded first shift registers; and
a second light emission control signal line corresponding to the sub-pixels in the i-th row among the N rows of sub-pixels is electrically connected to a second shift register in the i-th stage among the N cascaded first shift registers,
wherein 1≤i≤N, and i is a positive integer.

13. The display panel according to claim 10, wherein
delay time corresponding to each row of sub-pixels of the plurality of sub-pixels is equal;
N rows of sub-pixels are provided in the display panel;
the first scan driving circuit and the second scan driving circuit are a same scan driving circuit, and the same scan driving circuit comprises N cascaded third shift registers;
a first light emission control signal line corresponding to sub-pixels in an i-th row among the N rows of sub-pixels is electrically connected to a third shift register in an i-th stage among the N cascaded third shift registers, and a first light emission control signal line corresponding to sub-pixels in an N-th row among the N rows of sub-pixels is electrically connected to a third shift register in an N-th stage among the N cascaded third shift registers; and a second light emission control signal line corresponding to the sub-pixels in the i-th row among the N rows of sub-pixels is electrically connected to a third shift register in an (i+1)-th stage among the N cascaded third shift registers, and a second light emission control signal line corresponding to the sub-pixels in the N-th row among the N rows of sub-pixels is electrically connected to a third shift register in a first stage among the N cascaded third shift registers,
wherein 1≤i≤N−1, and i is a positive integer.

14. The display panel according to claim 10, wherein
the plurality of sub-pixels comprise first sub-pixel rows and second sub-pixel rows, wherein
a maximum capacitance sub-pixel in a first sub-pixel row of the first sub-pixel rows and a maximum capacitance sub-pixel in a second sub-pixel row of the second sub-pixel rows have different emitted colors, and a capacitance value of a pixel capacitor of the maximum capacitance sub-pixel in the first sub-pixel row is greater than a capacitance value of a pixel capacitor of the maximum capacitance sub-pixel in the second sub-pixel row;
delay time corresponding to the first sub-pixel row is greater than delay time corresponding to the second sub-pixel row;
the second light emission control signal line comprises a first light emission control signal sub-line and a second light emission control signal sub-line, a gate of a cathode switch transistor corresponding to the first sub-pixel row is electrically connected to the first light emission control signal sub-line, and a gate of a cathode switch transistor corresponding to the second sub-pixel row is electrically connected to the second light emission control signal sub-line; and
the second scan driving circuit comprises a first scan sub-circuit and a second scan sub-circuit, the first scan sub-circuit is electrically connected to the first light emission control signal sub-line, the second scan sub-circuit is electrically connected to the second light emission control signal sub-line.

15. The display panel according to claim 1, wherein
cathodes of light-emitting elements in sub-pixels in a same row among the plurality of sub-pixels are connected in series to form a cathode row;
cathode rows in sub-pixels in different rows among the plurality of sub-pixels are insulated; and
a cathode row of the cathode rows is electrically connected to the second power signal line by a cathode switch transistor corresponding to the cathode row.

16. The display panel according to claim 1, wherein
the cathode switch transistor comprises at least two sub-switch transistors, and the at least two sub-switch transistors are connected in series; and/or, the cathode switch transistor comprises a double-gate transistor.

17. A display device, comprising a display panel, wherein the display panel comprises a cathode switch transistor and a plurality of sub-pixels arranged in an array, wherein
a sub-pixel of the plurality of sub-pixels comprises a pixel driving circuit and a light-emitting element electrically connected to the pixel driving circuit, wherein the pixel driving circuit comprises a drive transistor and at least one light emission control transistor;
the drive transistor, the at least one light emission control transistor, the light-emitting element, and the cathode switch transistor are connected in series between a first power signal line and a second power signal line, wherein the at least one light emission control transistor is connected in series between an anode of the light-emitting element and the first power signal line, and the cathode switch transistor is connected in series between a cathode of the light-emitting element and the second power signal line; and a gate of a light emission control transistor of the at least one light emission control transistor is electrically connected to a first light emission control signal line, a gate of the cathode switch transistor is electrically connected to a second light emission control signal line, and in at least one light emission stage, start time of an effective pulse of a second light emission control signal of the second light emission control signal line lags behind start time of an effective pulse of a first light emission control signal of the first light emission control signal line; and wherein at least part of the plurality of sub-pixels have different emitted colors, a light-emitting element of light-emitting elements in the plurality of sub-pixels has a pixel capacitor corresponding to the light-emitting element, and capacitance values of pixel capacitors of light-emitting elements in sub-pixels of different emitted colors are different;

in at least one row of sub-pixels of the plurality of sub-pixels, a sub-pixel with a maximum capacitance value of a pixel capacitor of a light-emitting element is a maximum capacitance sub-pixel, and charging time of the pixel capacitor of the light-emitting element in the maximum capacitance sub-pixel is t1; and for at least one row of sub-pixels of the plurality of sub-pixels, in the at least one light emission stage, a duration in which start time of an effective pulse of a second light emission control signal of a second light emission control signal line corresponding to the at least one row of sub-pixels lags behind start time of an effective pulse of a first light emission control signal of a first light emission control signal line corresponding to the at least one row of sub-pixels is delay time, wherein the delay time is $\Delta t$, and $\Delta t \geq t1$.

18. A driving method of a display panel, wherein the display panel comprises a cathode switch transistor and a plurality of sub-pixels arranged in an array; a sub-pixel of the plurality of sub-pixels comprises a pixel driving circuit and a light-emitting element electrically connected to the pixel driving circuit, wherein the pixel driving circuit comprises a drive transistor and at least one light emission control transistor; the drive transistor, the at least one light emission control transistor, the light-emitting element, and the cathode switch transistor are connected in series between a first power signal line and a second power signal line, wherein the at least one light emission control transistor is connected in series between an anode of the light-emitting element and the first power signal line, and the cathode switch transistor is connected in series between a cathode of the light-emitting element and the second power signal line; and a gate of a light emission control transistor of the at least one light emission control transistor is electrically connected to a first light emission control signal line, and a gate of the cathode switch transistor is electrically connected to a second light emission control signal line;

wherein at least part of the plurality of sub-pixels have different emitted colors, a light-emitting element of light-emitting elements in the plurality of sub-pixels has a pixel capacitor corresponding to the light-emitting element, and capacitance values of pixel capacitors of light-emitting elements in sub-pixels of different emitted colors are different;

in at least one row of sub-pixels of the plurality of sub-pixels, a sub-pixel with a maximum capacitance value of a pixel capacitor of a light-emitting element is a maximum capacitance sub-pixel, and charging time of the pixel capacitor of the light-emitting element in the maximum capacitance sub-pixel is t1; and for at least one row of sub-pixels of the plurality of sub-pixels, in the at least one light emission stage, a duration in which start time of an effective pulse of a second light emission control signal of a second light emission control signal line corresponding to the at least one row of sub-pixels lags behind start time of an effective pulse of a first light emission control signal of a first light emission control signal line corresponding to the at least one row of sub-pixels is delay time, wherein the delay time is $\Delta t$, and $\Delta t \geq t1$; and wherein the driving method comprises:

applying a first light emission control signal to the first light emission control signal line; and applying a second light emission control signal to the second light emission control signal line, wherein in at least one light emission stage, start time of an effective pulse of the second light emission control signal lags behind start time of an effective pulse of the first light emission control signal.

19. The driving method according to claim 18, wherein the plurality of sub-pixels comprise a first color sub-pixel, a second color sub-pixel, and a third color sub-pixel, wherein a capacitance value of a pixel capacitor of a light-emitting element in the first color sub-pixel is greater than a capacitance value of a pixel capacitor of a light-emitting element in the second color sub-pixel, and the capacitance value of the pixel capacitor of the light-emitting element in the second color sub-pixel is greater than a capacitance value of a pixel capacitor of a light-emitting element in the third color sub-pixel; charging time of the pixel capacitor of the light-emitting element in the first color sub-pixel is t2, wherein $\Delta t \geq t2$.

20. The driving method according to claim 19, wherein delay time corresponding to each row of sub-pixels of the plurality of sub-pixels is equal.

* * * * *